(12) United States Patent
Fang et al.

(10) Patent No.: US 11,742,400 B2
(45) Date of Patent: Aug. 29, 2023

(54) FIN FIELD EFFECT TRANSISTOR (FINFET) DEVICE STRUCTURE WITH DEEP CONTACT STRUCTURE

(71) Applicant: Taiwan Semiconductor Manufacturing Co., Ltd., Hsinchu (TW)

(72) Inventors: Ting Fang, Kaohsiung (TW); Da-Wen Lin, Hsinchu (TW); Fu-Kai Yang, Hsinchu (TW); Chen-Ming Lee, Taoyuan County (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

(21) Appl. No.: 16/432,594

(22) Filed: Jun. 5, 2019

(65) Prior Publication Data

US 2020/0058747 A1 Feb. 20, 2020

Related U.S. Application Data

(60) Provisional application No. 62/718,803, filed on Aug. 14, 2018.

(51) Int. Cl.
| | |
|---|---|
| *H01L 29/417* | (2006.01) |
| *H01L 29/423* | (2006.01) |
| *H01L 29/78* | (2006.01) |
| *H01L 29/40* | (2006.01) |

(Continued)

(52) U.S. Cl.
CPC .......... *H01L 29/423* (2013.01); *H01L 29/401* (2013.01); *H01L 29/41791* (2013.01); *H01L 29/456* (2013.01); *H01L 29/66795* (2013.01); *H01L 29/785* (2013.01)

(58) Field of Classification Search
CPC ... H01L 29/423; H01L 29/401; H01L 29/785; H01L 29/41791; H01L 29/456; H01L 29/41766; H01L 29/0642; H01L 29/7855; H01L 29/417; H01L 23/485; H01L 21/76814; H01L 21/768; H01L 21/8238; H01L 29/411791; H01L 27/0924
See application file for complete search history.

(56) References Cited

U.S. PATENT DOCUMENTS

| | | | | |
|---|---|---|---|---|
| 10,177,038 B1 * | 1/2019 | Lee | ...................... | H01L 27/0886 |
| 10,797,050 B2 * | 10/2020 | Chen | ................. | H01L 29/66545 |

(Continued)

*Primary Examiner* — Caridad Everhart
(74) *Attorney, Agent, or Firm* — Birch, Stewart, Kolasch & Birch, LLP

(57) ABSTRACT

A FinFET device structure and method for forming the same is provided. The FinFET device structure includes an isolation structure formed over a substrate, and a gate structure formed over the isolation structure. The FinFET device structure includes a first dielectric layer formed over the isolation structure and adjacent to the gate structure and a source/drain (S/D) contact structure formed in the first dielectric layer. The FinFET device structure also includes a deep contact structure formed through the first dielectric layer and adjacent to the S/D contact structure. The deep contact structure is through the isolation structure, and a bottom surface of the S/D contact structure is higher than a bottom surface of the deep contact structure.

20 Claims, 24 Drawing Sheets

(51) Int. Cl.
*H01L 29/66* (2006.01)
*H01L 29/45* (2006.01)

(56) References Cited

U.S. PATENT DOCUMENTS

| | | | |
|---|---|---|---|
| 2008/0171419 A1* | 7/2008 | Wen | H01L 21/84 438/412 |
| 2009/0068814 A1* | 3/2009 | Cho | H01L 27/0207 438/386 |
| 2010/0155835 A1* | 6/2010 | Seliskar | H01L 29/42384 257/331 |
| 2013/0062673 A1* | 3/2013 | Masuoka | H01L 27/14616 257/291 |
| 2013/0095625 A1* | 4/2013 | Masuoka | H01L 29/7827 438/268 |
| 2015/0372100 A1* | 12/2015 | Zschatzsch | H01L 29/66628 257/384 |
| 2016/0308013 A1* | 10/2016 | Masuoka | H01L 29/4908 |
| 2016/0380002 A1* | 12/2016 | Cheng | H01L 21/30604 438/157 |
| 2018/0069101 A1* | 3/2018 | Chang | H01L 29/42372 |
| 2019/0097006 A1* | 3/2019 | Li | H01L 29/41725 |
| 2019/0157405 A1* | 5/2019 | Huang | H01L 21/3115 |
| 2019/0296142 A1* | 9/2019 | Ebrish | H01L 21/823418 |
| 2020/0006546 A1* | 1/2020 | Mehandru | H01L 29/41791 |

* cited by examiner

FIN FIELD EFFECT TRANSISTOR (FINFET) DEVICE STRUCTURE WITH DEEP CONTACT STRUCTURE

CROSS REFERENCE TO RELATED APPLICATIONS

This application claims the benefit of U.S. Provisional Application No. 62/718,803, filed on Aug. 14, 2018, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
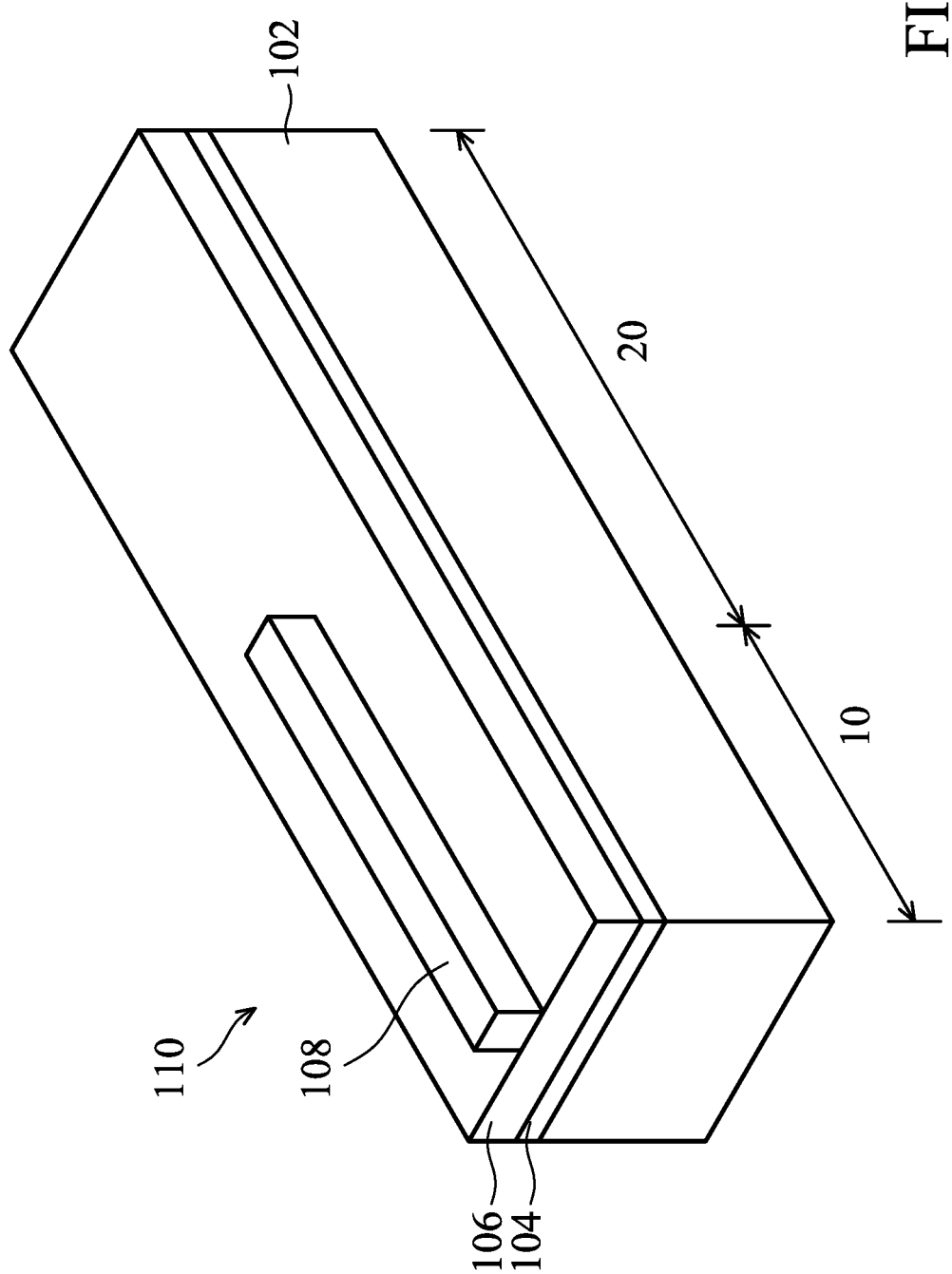
FIGS. 1A-1H show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1H show perspective representations of various stages of forming a FinFET device structure 100, in accordance with some embodiments of the disclosure.

Referring to FIG. 1A, a substrate 102 is provided. The substrate 102 includes a first region 10 and a second region 20. In some embodiments, the first region 10 is an active region, and the second region 20 is a peripheral region. The FinFET structure is formed in the first region 10 to perform some function, and the deep contact structure 184 (as shown in FIG. 3K) is formed in the second region 20 for releasing electrons or charges accumulated in the substrate 102.

The substrate 102 may be made of silicon or other semiconductor materials. Alternatively or additionally, the substrate 102 may include other elementary semiconductor materials such as germanium. In some embodiments, the substrate 102 is a doped substrate. In some embodiments, the substrate 102 is a p-doped substrate. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
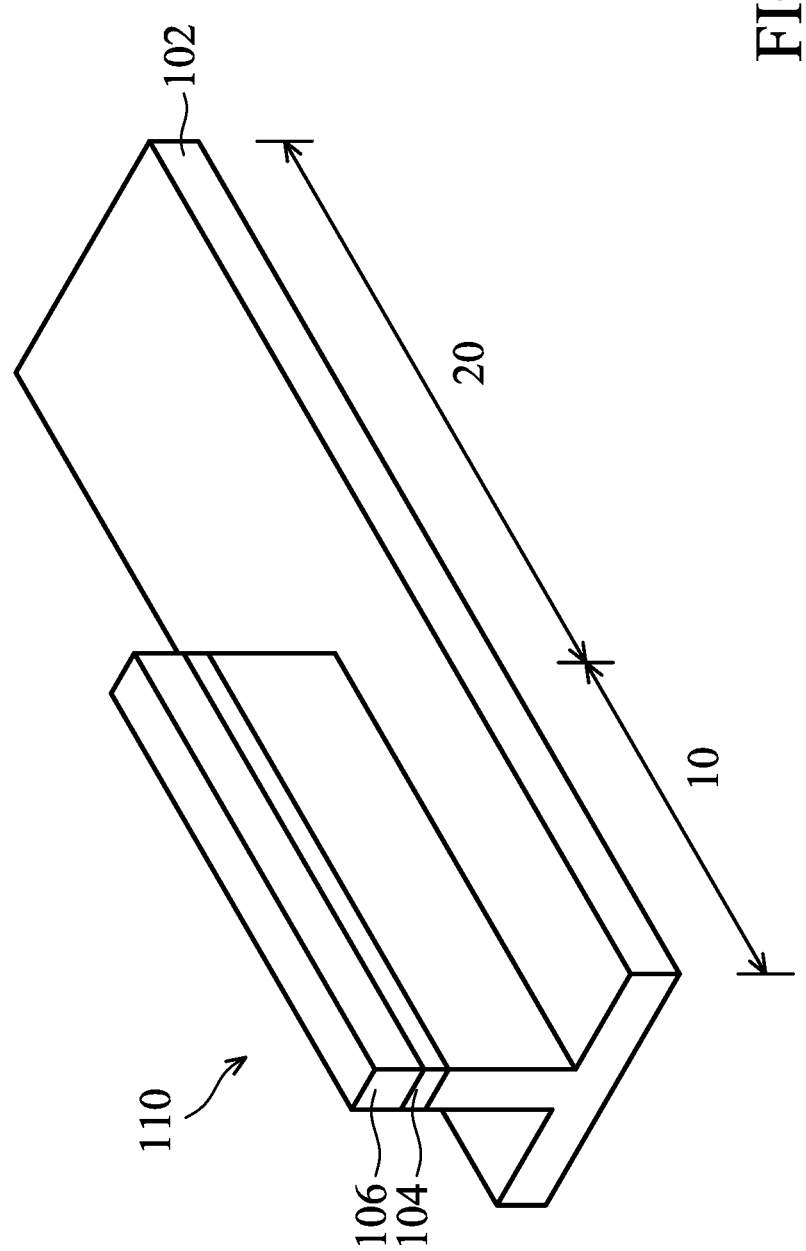

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
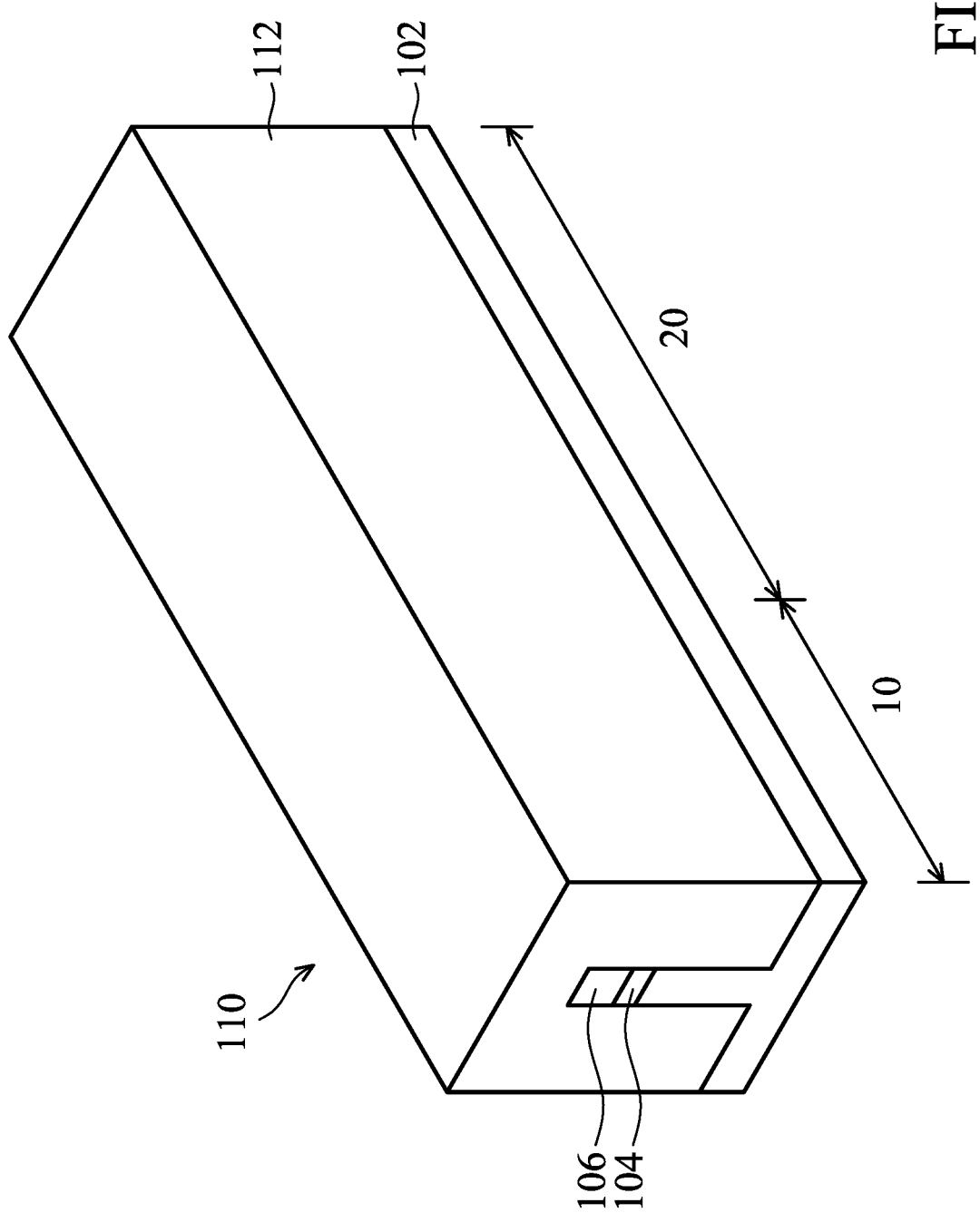

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process. Afterwards, the patterned dielectric layer 104 and the patterned mask layer 106 are removed.

Figure 1D:
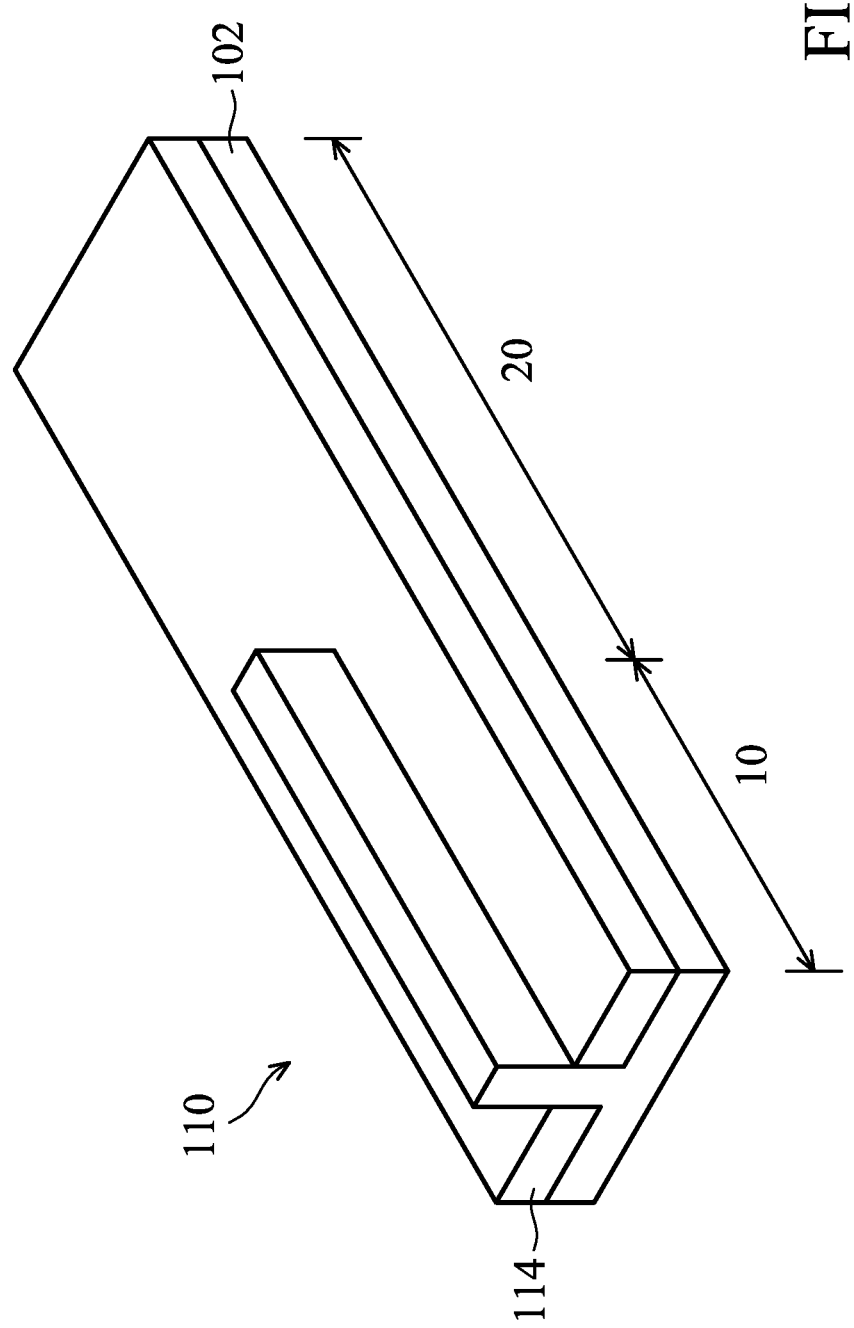

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
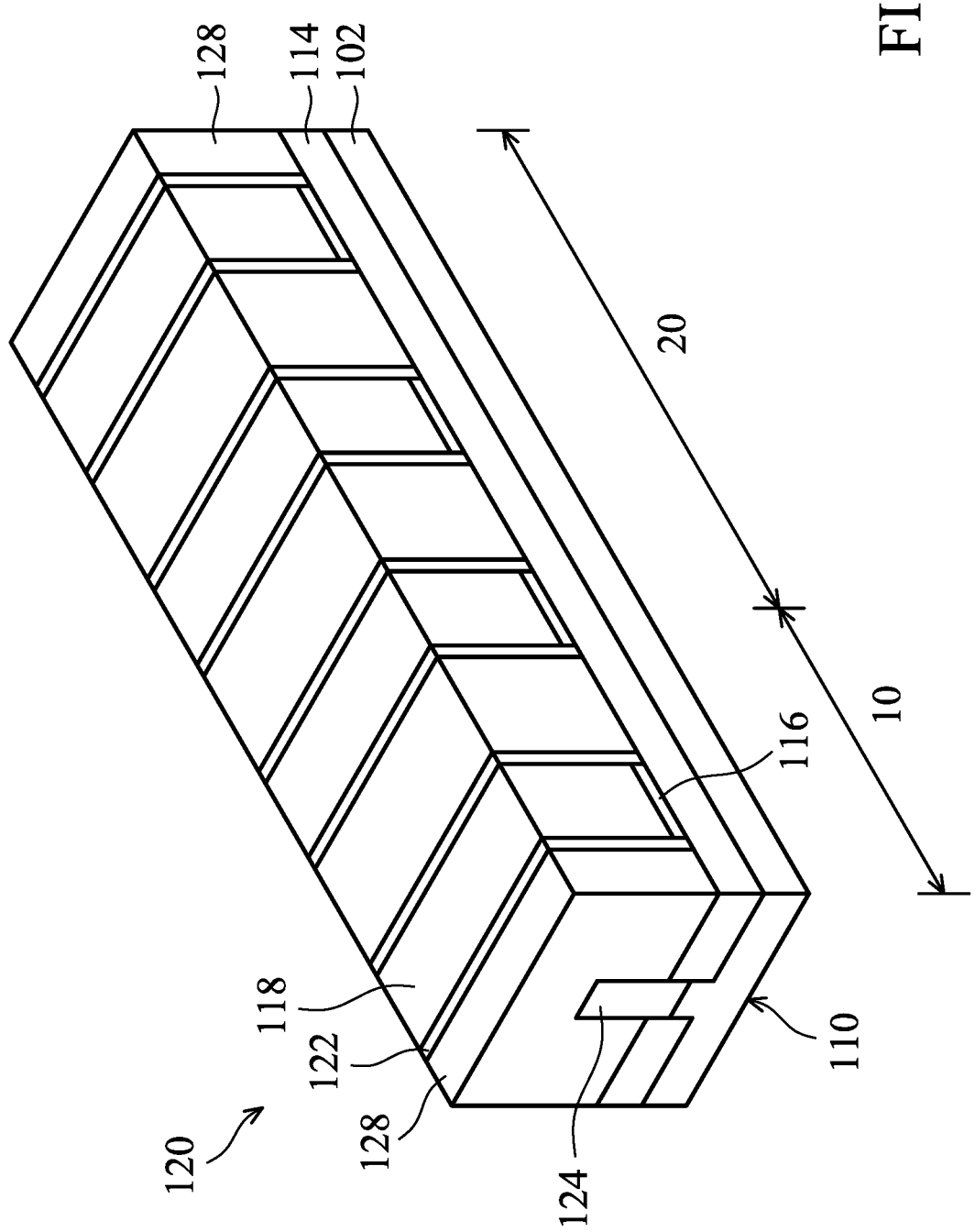

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

Afterwards, source/drain (S/D) structures 124 are formed over the fin structure 110. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like. In some embodiments, when an N-type MOS (NMOS) device is desired, the source/drain epitaxial structures include an epitaxially grown silicon phosphor (epi SiP). Alternatively, when a P-type MOS (PMOS) device is desired, epitaxial source/drain structures include an epitaxially growing silicon germanium (SiGe).

After the source/drain (S/D) structures 124 are formed, a contact etch stop layer (CESL) (not shown) is formed over the substrate 102, and a first dielectric layer 128 is formed over the contact etch stop layer. The first dielectric layer 128 is an inter-layer dielectric (ILD) layer. In some other embodiments, the CESL is made of silicon nitride, silicon oxynitride, and/or other applicable materials. The contact etch stop layer may be formed by plasma enhanced CVD, low-pressure CVD, ALD, or other applicable processes.

The first dielectric layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first dielectric layer 128 may be formed by chemical vapor deposition (CVD), physical vapor deposition, (PVD), atomic layer deposition (ALD), spin-on coating, or another applicable process.

Afterwards, a polishing process is performed on the first dielectric layer 128 until the top surface of the dummy gate structure 120 is exposed. In some embodiments, the first dielectric layer 128 is planarized by a chemical mechanical polishing (CMP) process.

Figure 1F:
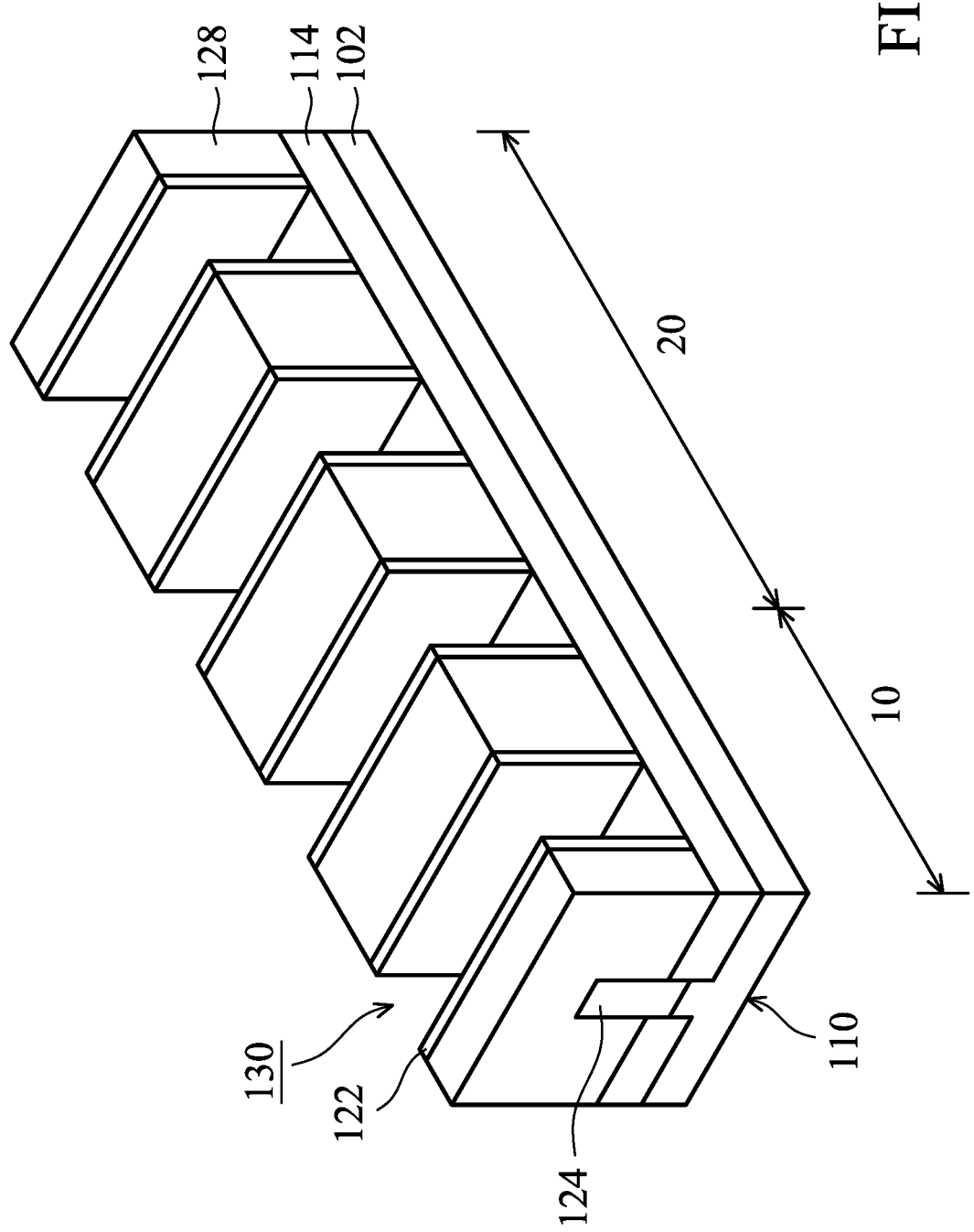

Afterwards, as shown in FIG. 1F, the dummy gate structure 120 is removed to form a trench 130 in the first dielectric layer 128, in accordance with some embodiments. The dummy gate dielectric layer 116 and the dummy gate electrode layer 118 are removed by an etching process, such as a dry etching process or a wet etching process.

Figure 1G:
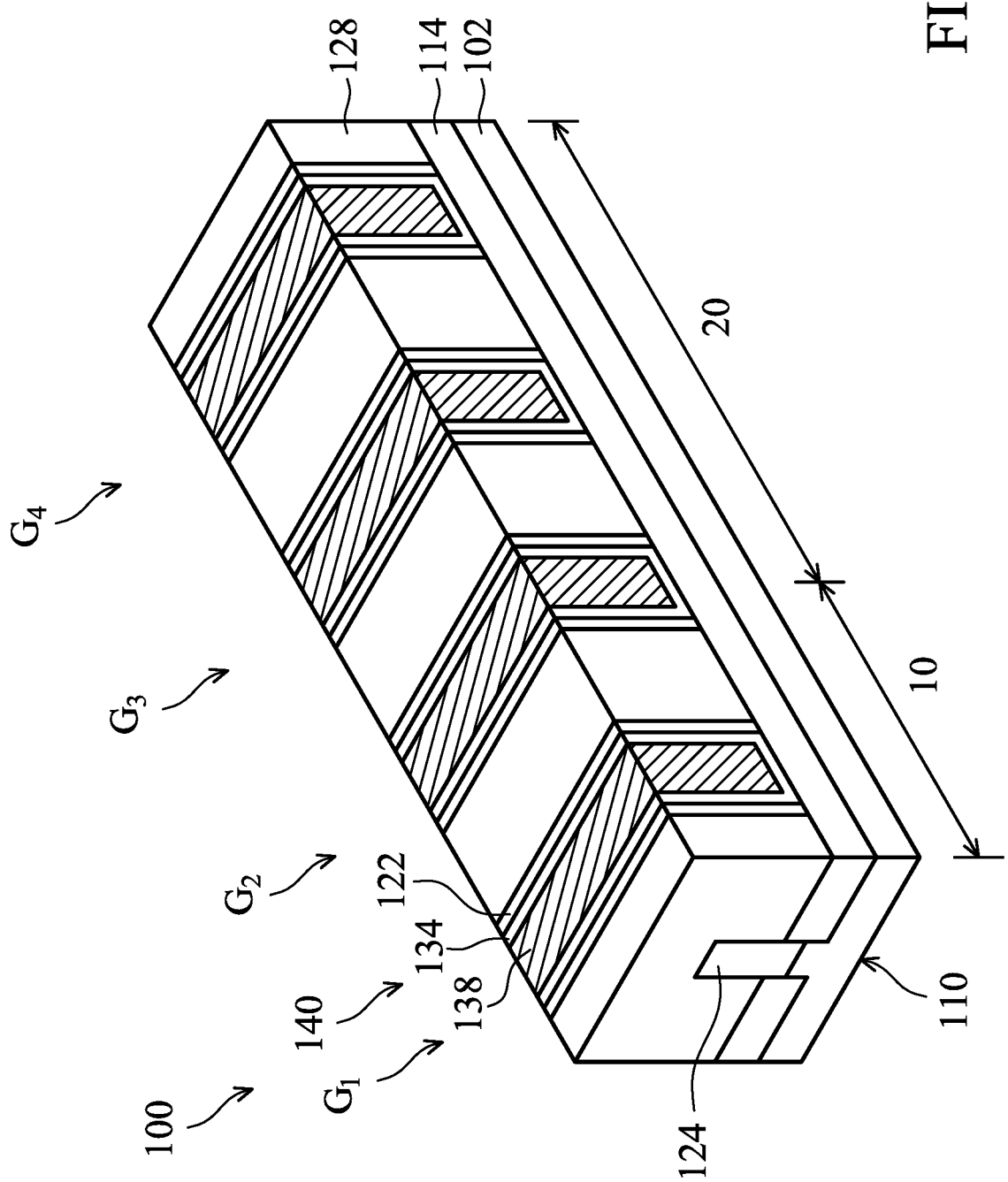

Next, as shown in FIG. 1G, a number of gate structures 140 are formed in the trench 130, in accordance with some embodiments. The gate structures 140 includes a first gate structure $G_1$, a second gate structure $G_2$, a third gate structure $G_3$ and a fourth gate structure $G_4$. Each of the gate structures 140 includes a gate dielectric layer 134 and a gate electrode layer 138. The first gate structure $G_1$ and the second gate structure $G_2$ are formed over the fin structure 110 and the isolation structure 114. The third gate structure $G_3$ and the fourth gate structure $G_4$ are formed over the isolation structure 114.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials. In some embodiments, the gate electrode layer 138 includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1H:
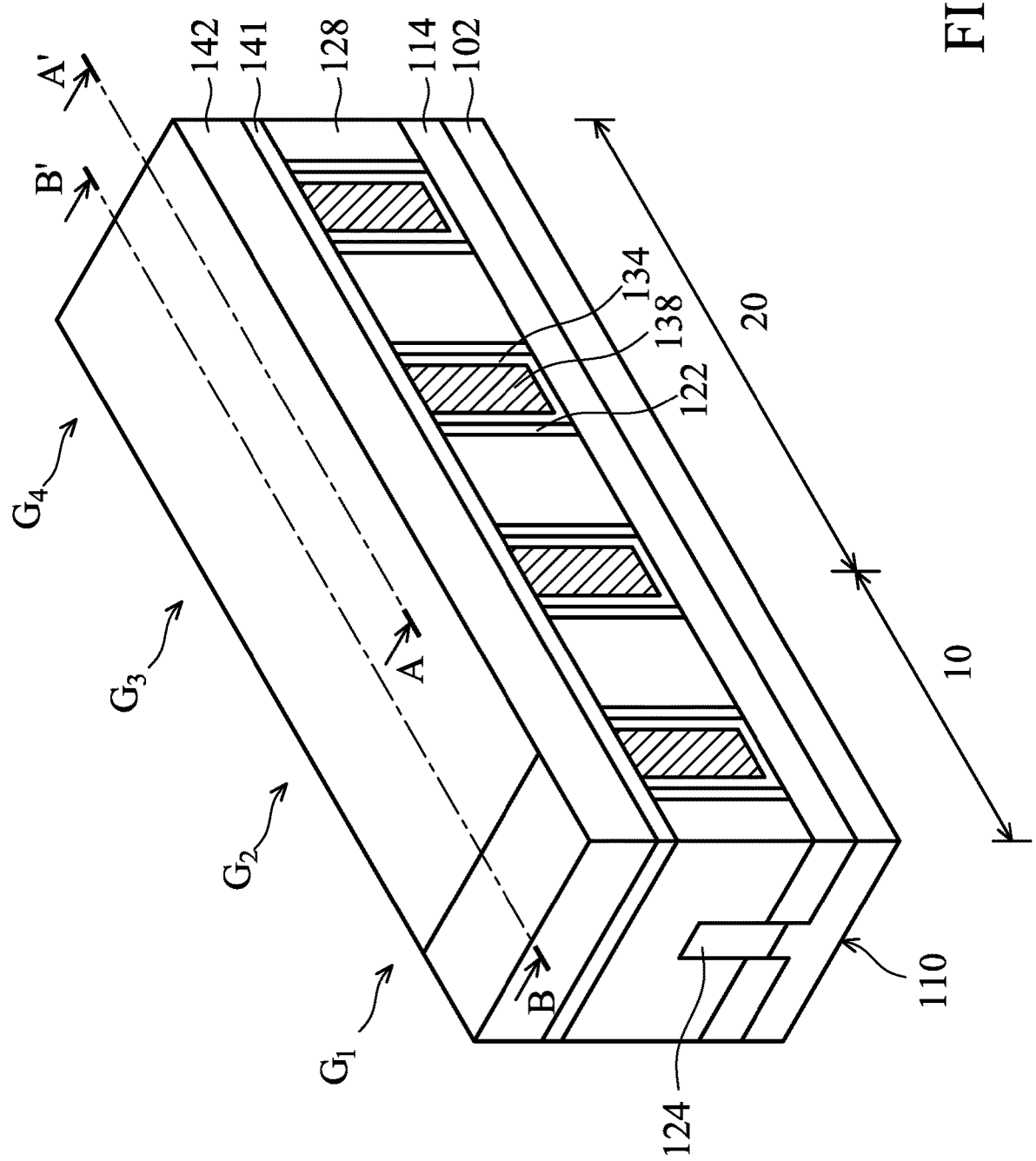

Next, as shown in FIG. 1H, a first etching stop layer 141 is formed over the gate structure 140 and over the first dielectric layer 128, and a second dielectric layer 142 is formed over the first dielectric layer 128, in accordance with some embodiments.

The first etching stop layer 141 may be made of silicon nitride, silicon oxynitride, and/or other applicable materials.

The first etching stop layer 141 may be formed by plasma enhanced CVD, low-pressure CVD, ALD, or other applicable processes. The second dielectric layer 142 may be a single layer or multiple layers. The second dielectric layer 142 is made of silicon oxide (SiOx), silicon nitride (SixNy), silicon oxynitride (SiON), dielectric material(s) with low dielectric constant (low-k), or combinations thereof. In some embodiments, the second dielectric layer 142 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the second dielectric layer 142 is deposited by a plasma enhanced chemical vapor deposition (PECVD) process or by a spin coating process.

Figure 2:
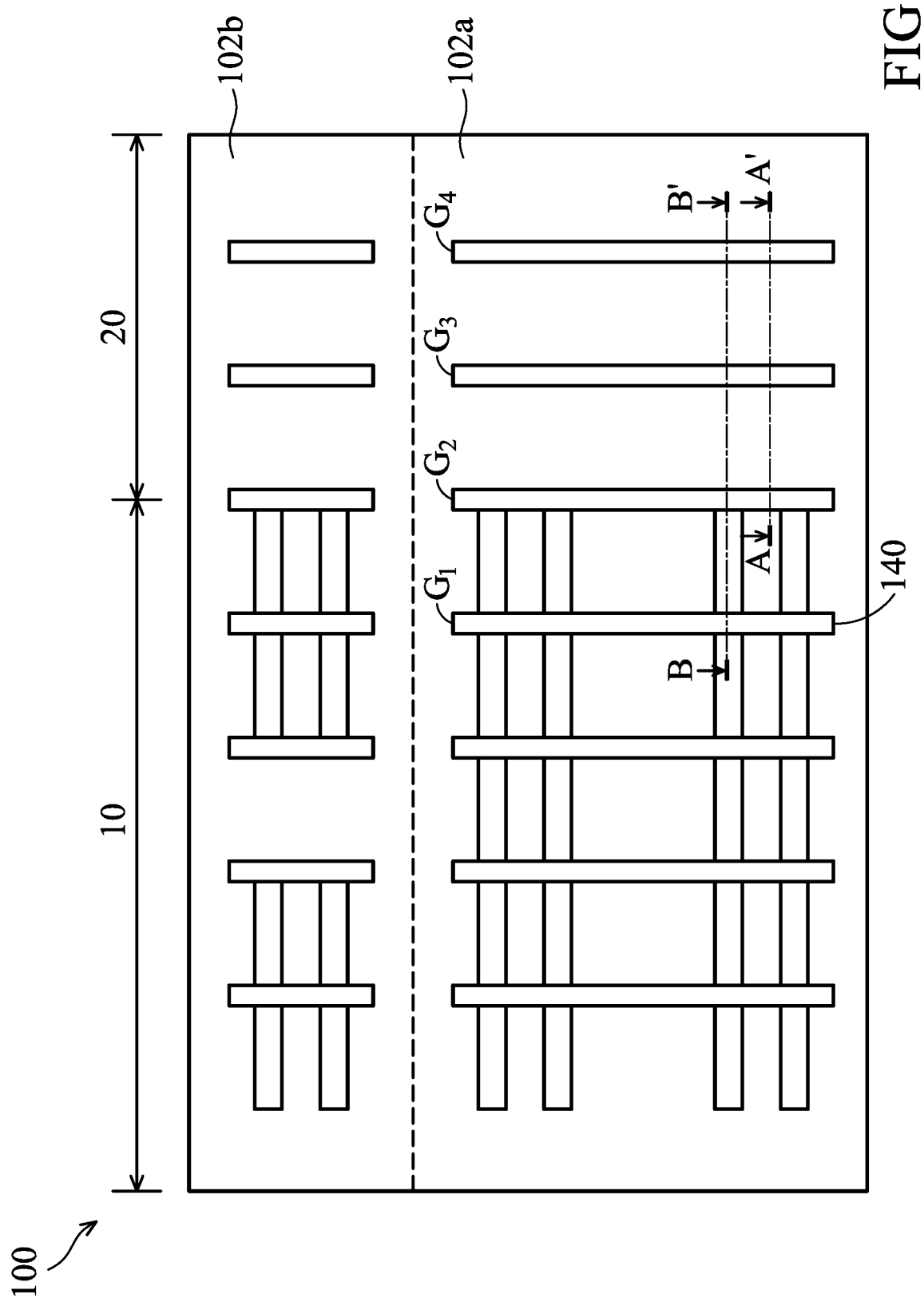
FIG. 2 shows a top-view of FinFET device structure, in accordance with some embodiments of the disclosure.

FIG. 2 shows a top-view of FinFET device structure 100, in accordance with some embodiments of the disclosure. The substrate 102 includes the first region 10 and the second region 20. The substrate 102 includes a p-type substrate 102a and a n-type substrate 102b.

A number of fin structures 110 are formed in the first region 10 of the substrate 102. The first gate structure $G_1$ and the second gate structure $G_2$ are formed over the fin structure 110 and the isolation structure 114. The third gate structure $G_3$ and the fourth gate structure $G_4$ are formed over the isolation structure 114.

Figure 3A:
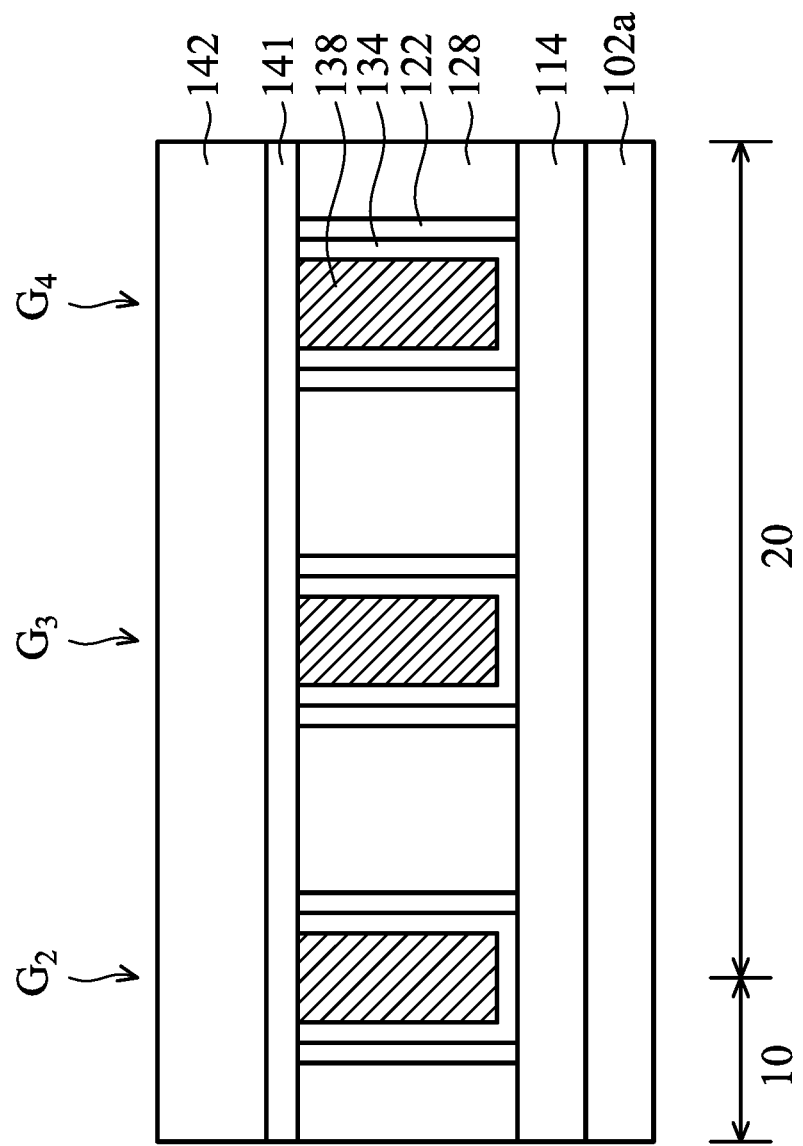
FIGS. 3A-3K show cross-sectional representations of various stages of forming the FinFET device structure after the structure of FIG. 1H, in accordance with some embodiments of the disclosure.
Figure 3B:
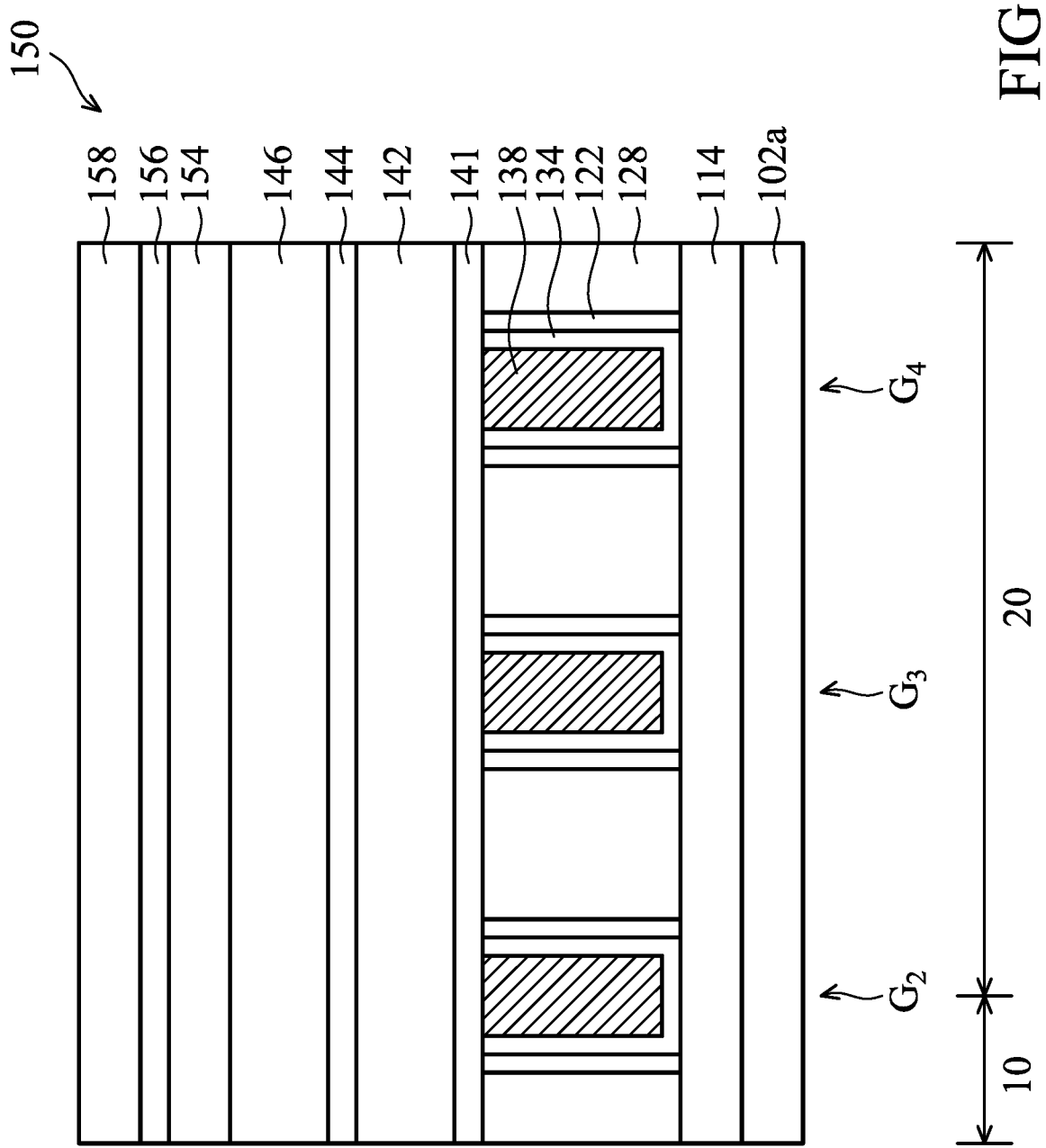
Figure 3C:
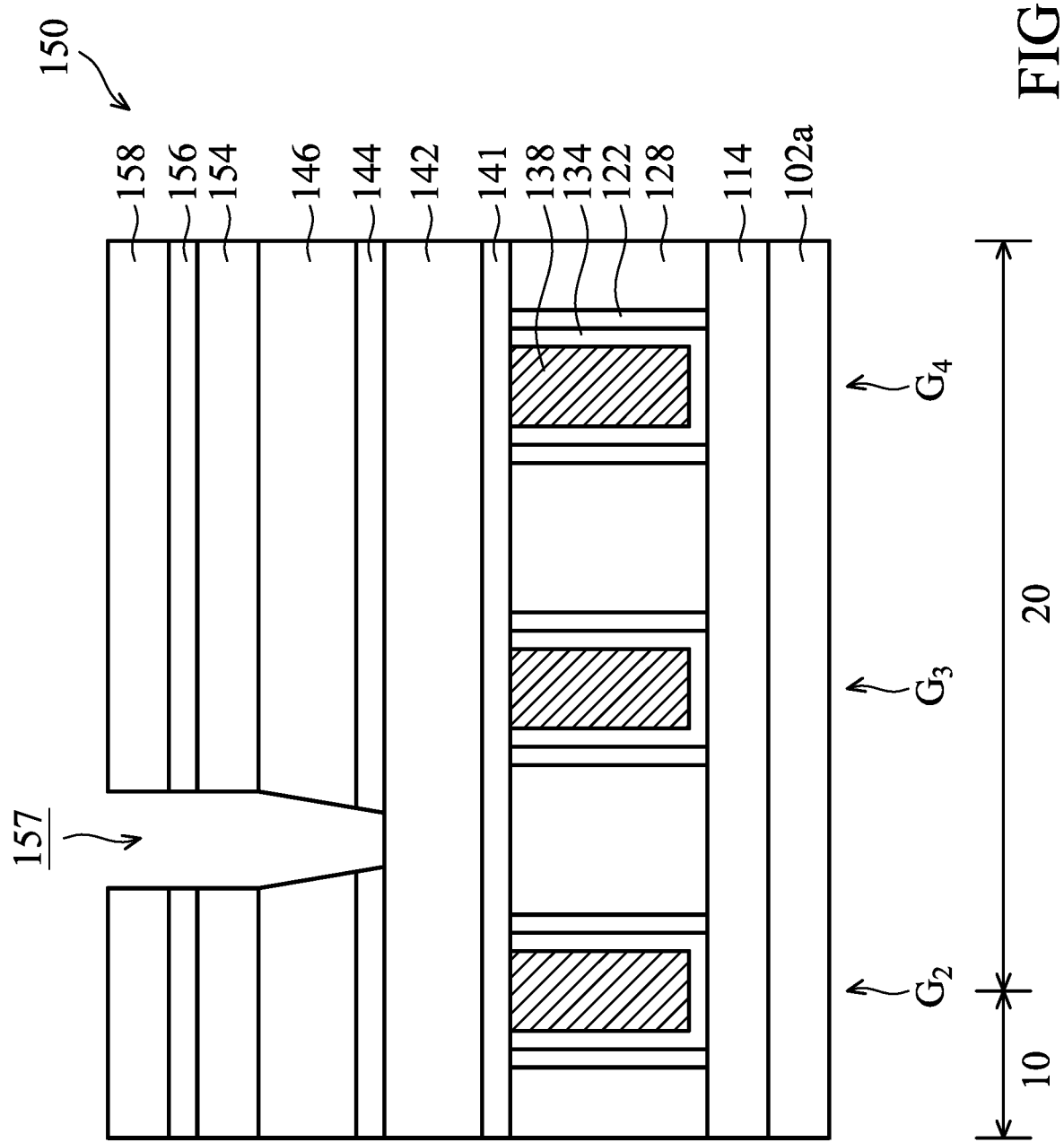
Figure 3D:
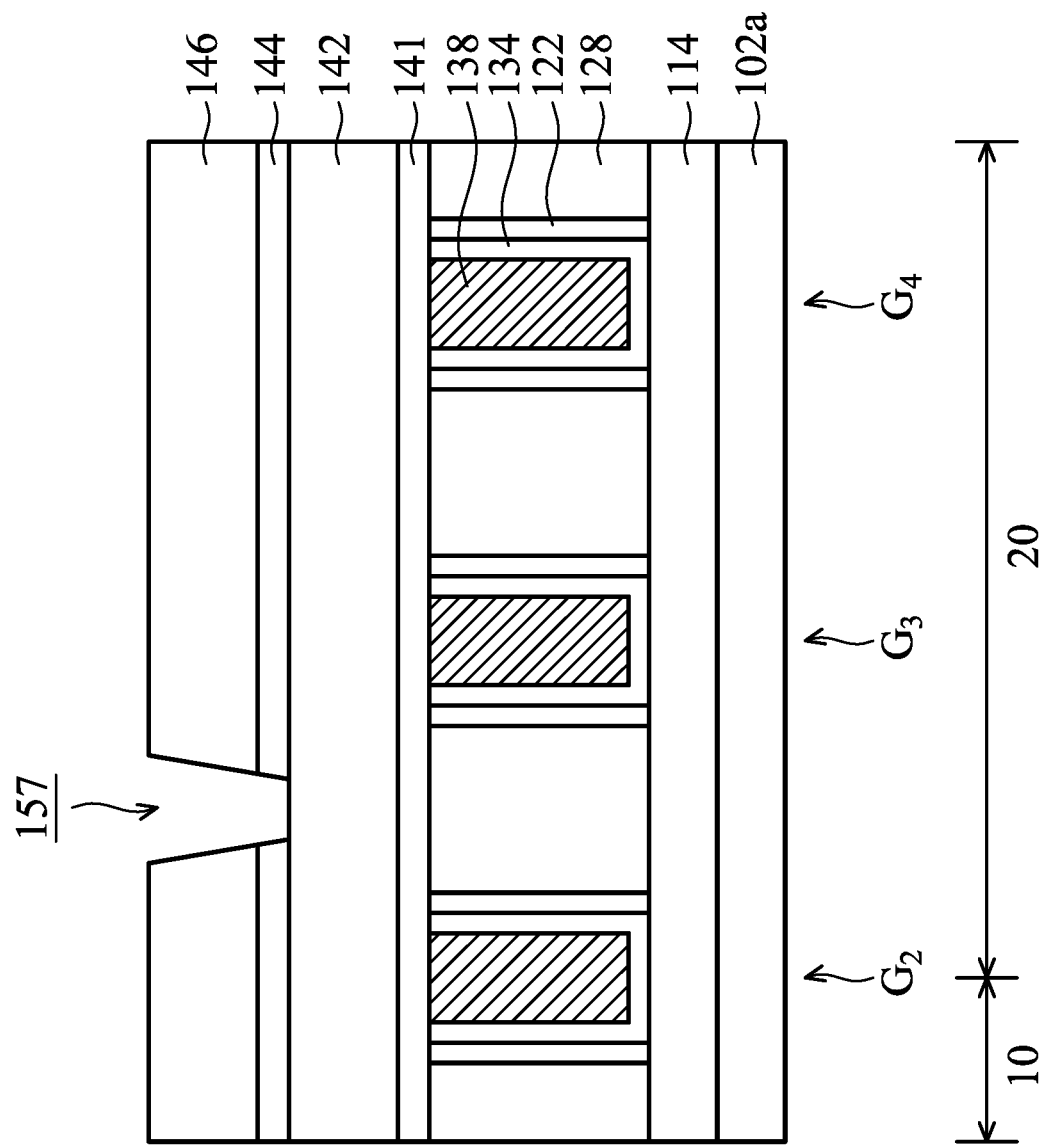
Figure 3E:
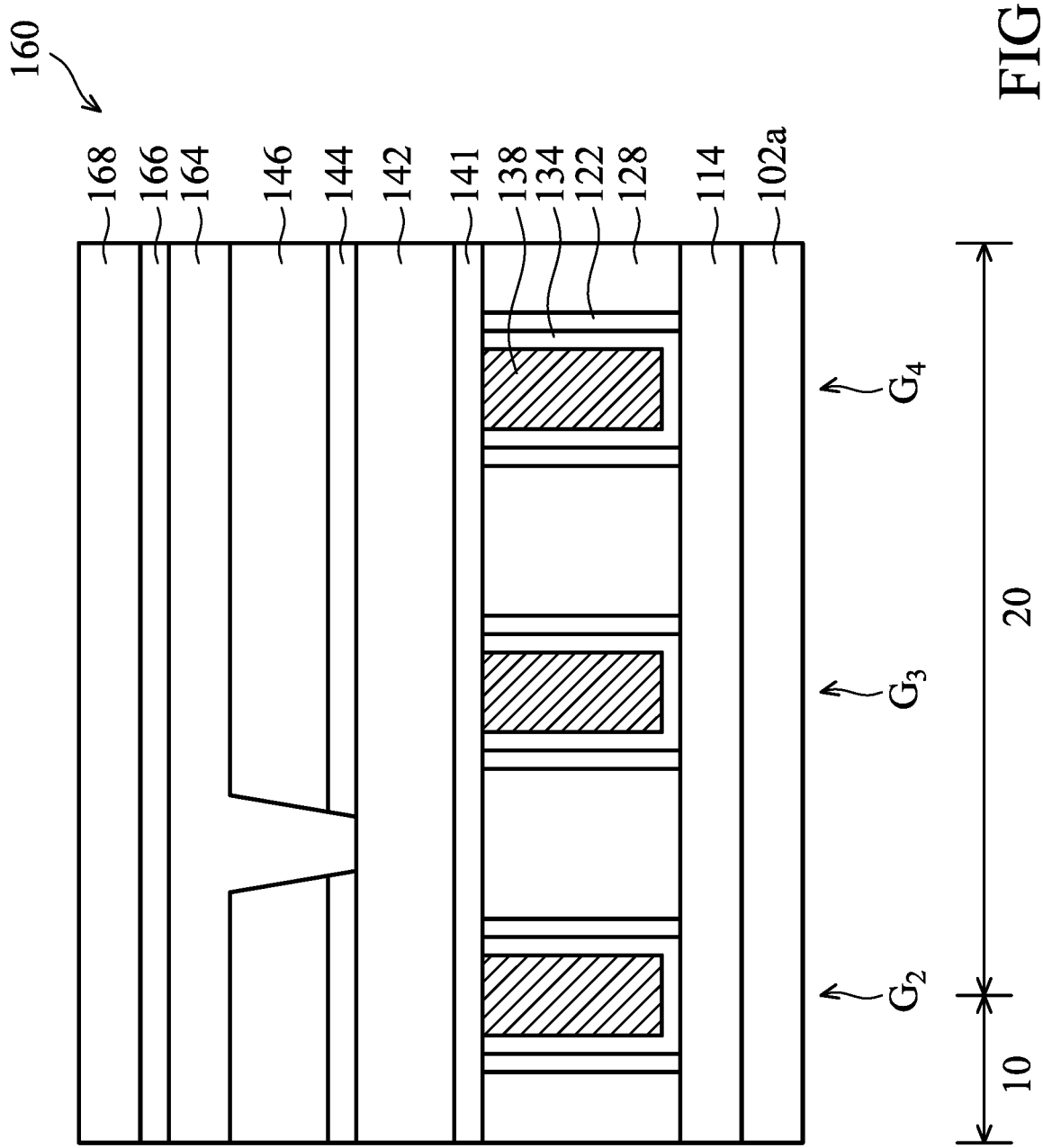
Figure 3F:
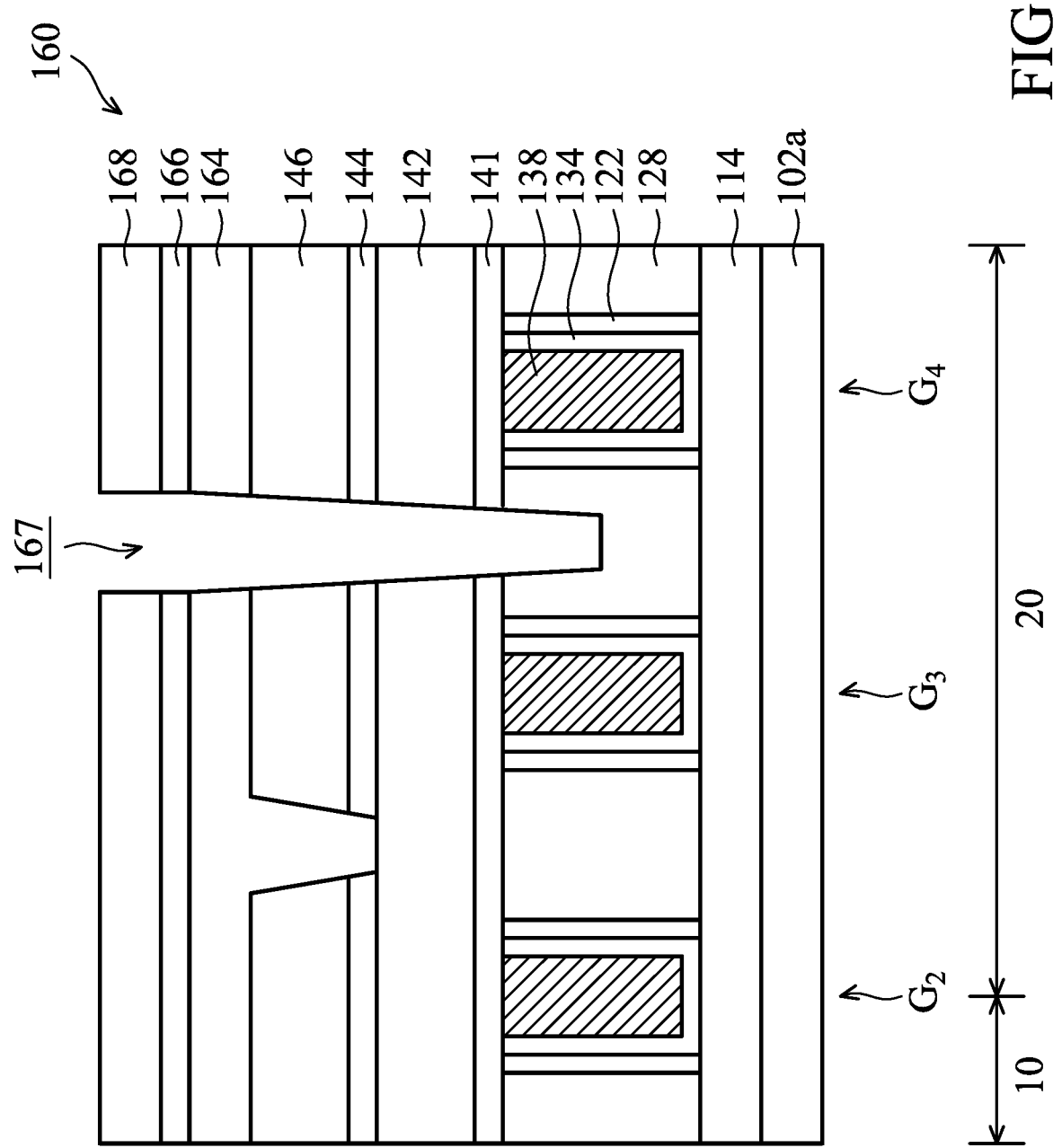
Figure 3G:
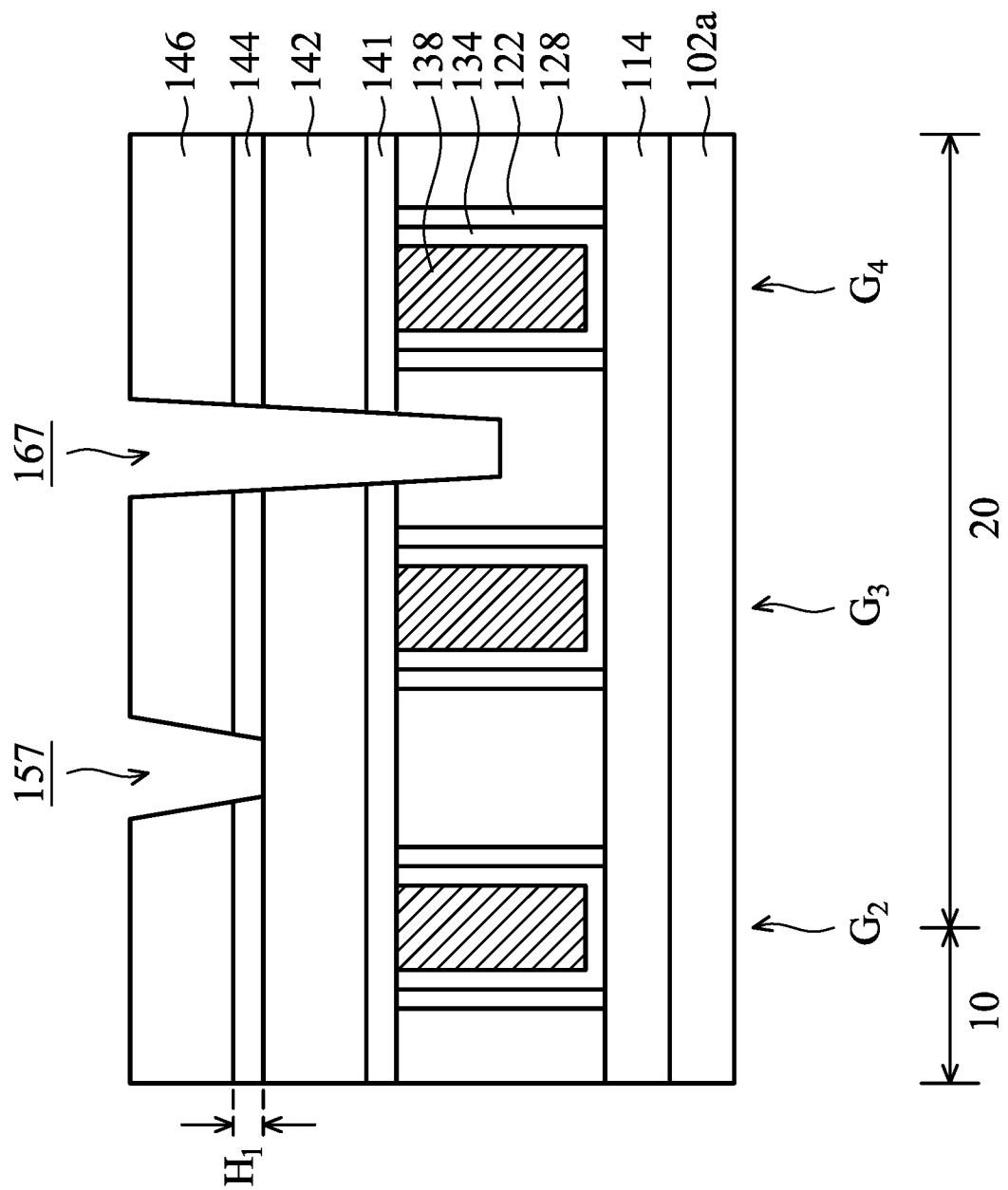
Figure 3H:
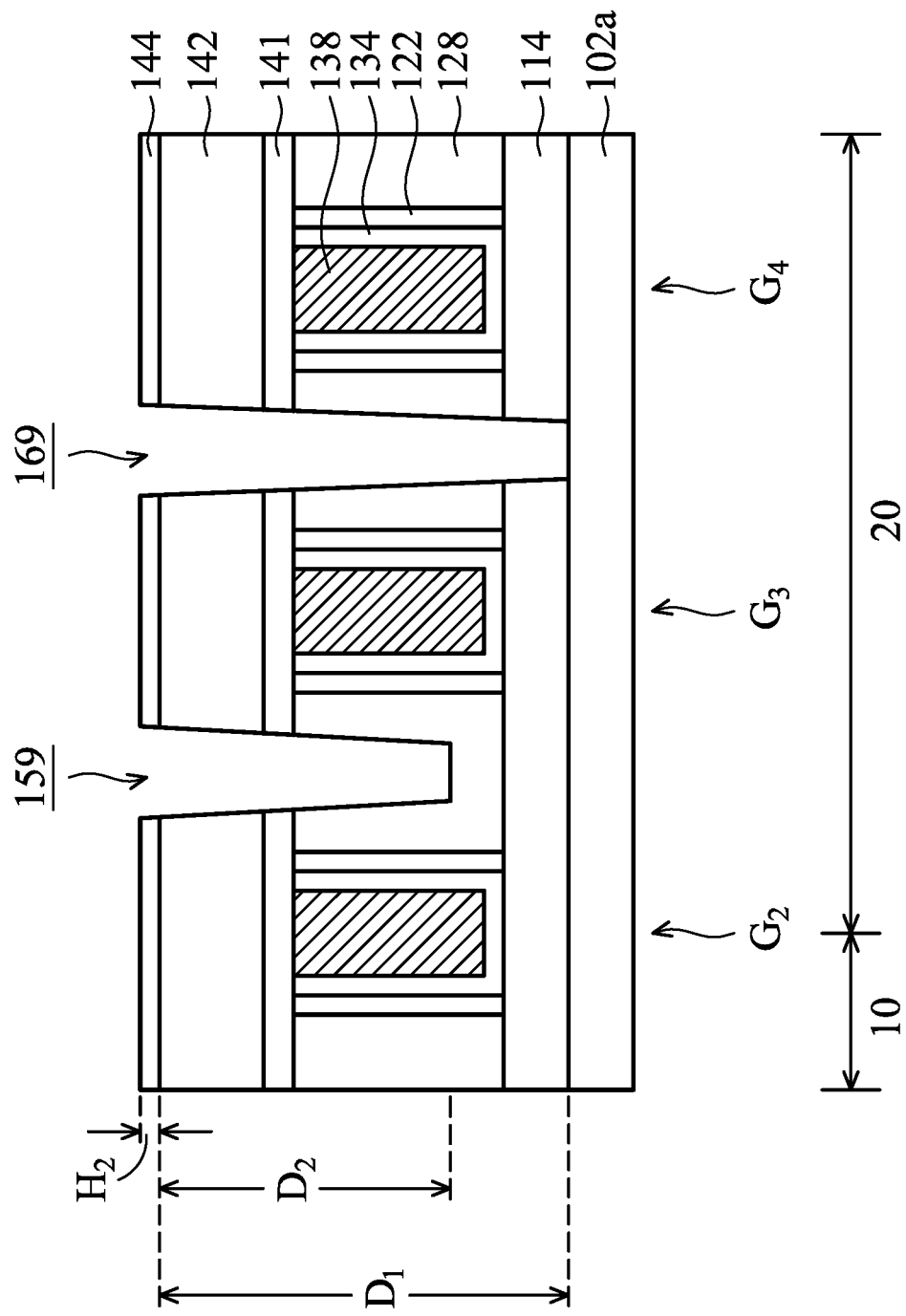
Figure 3I:
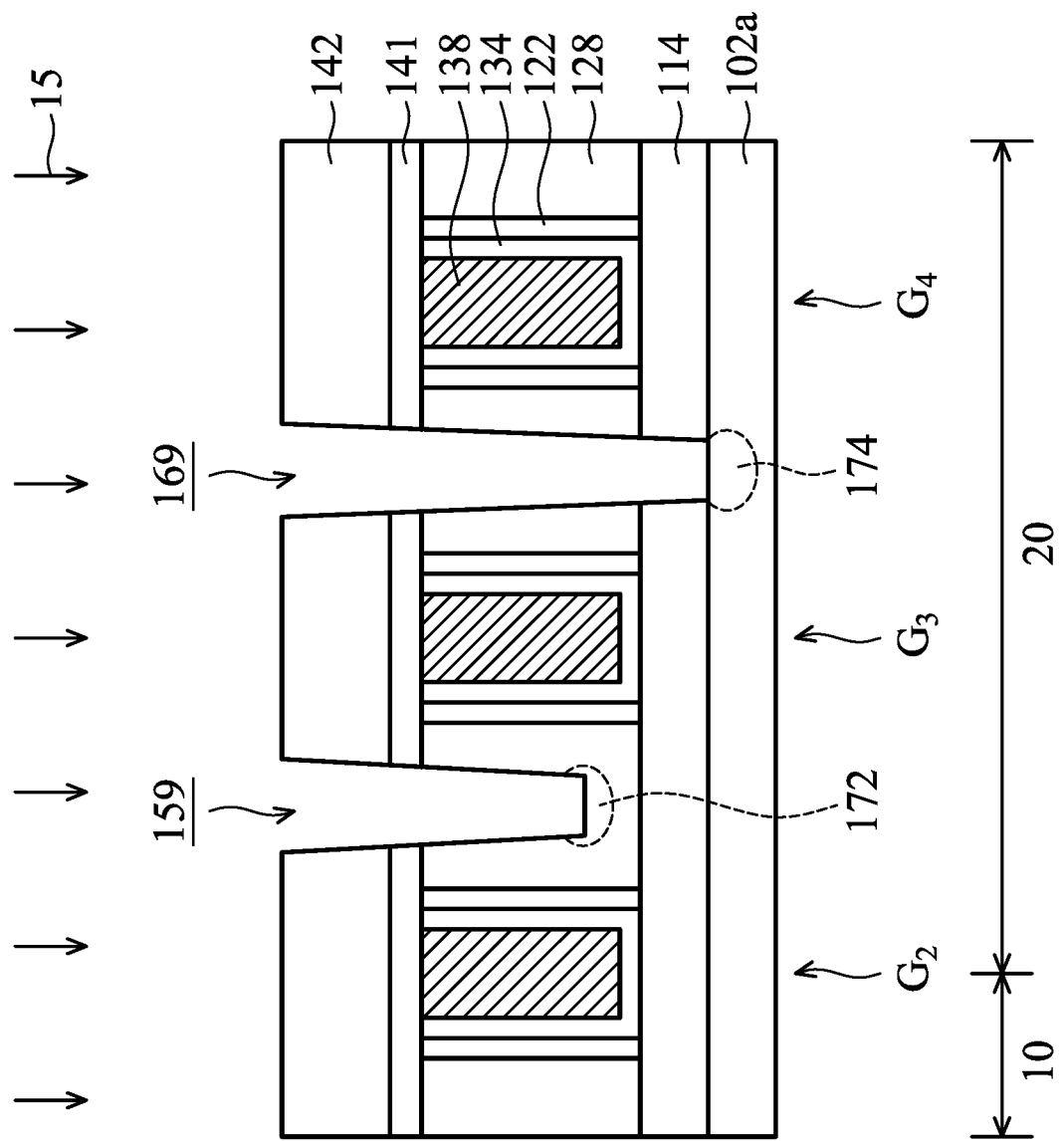
Figure 3J:
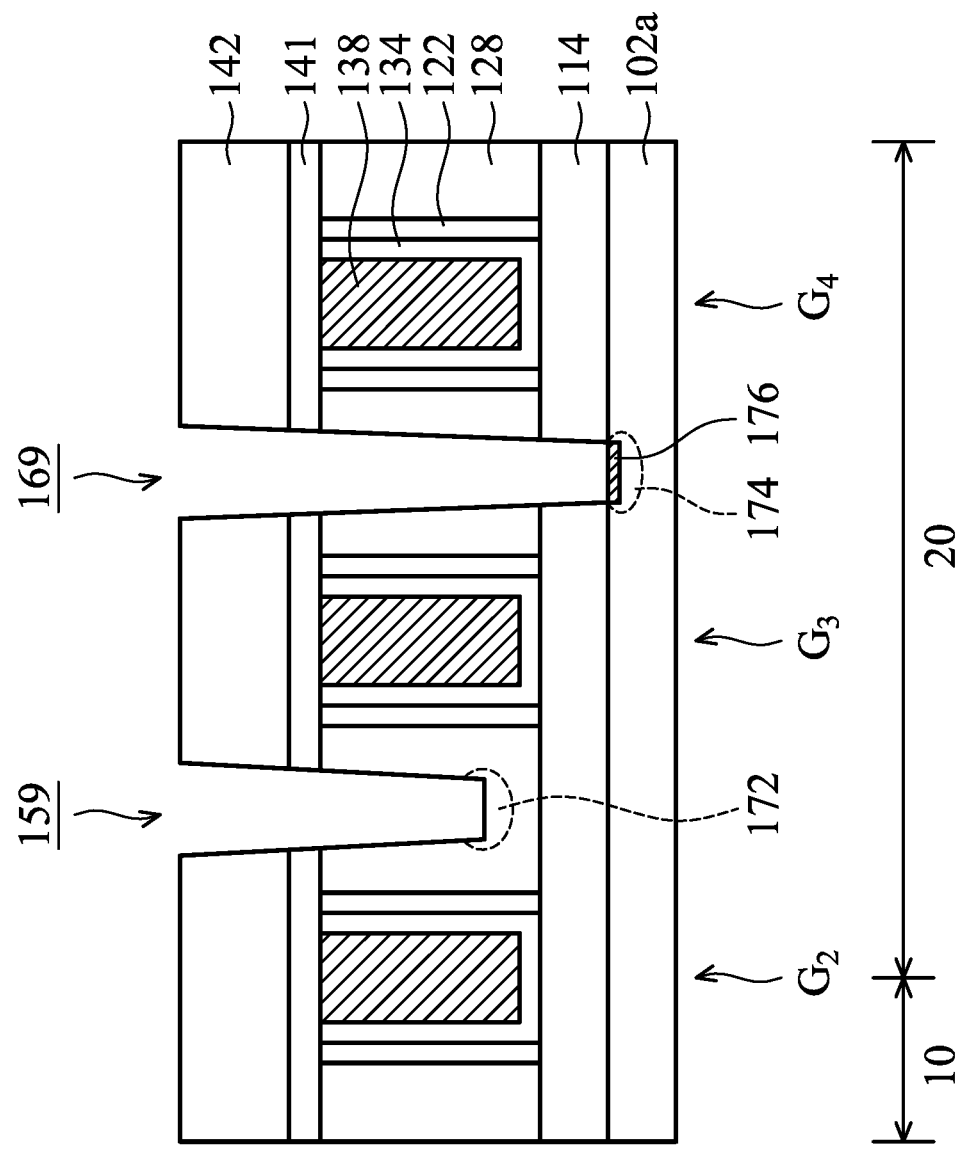
Figure 3K:
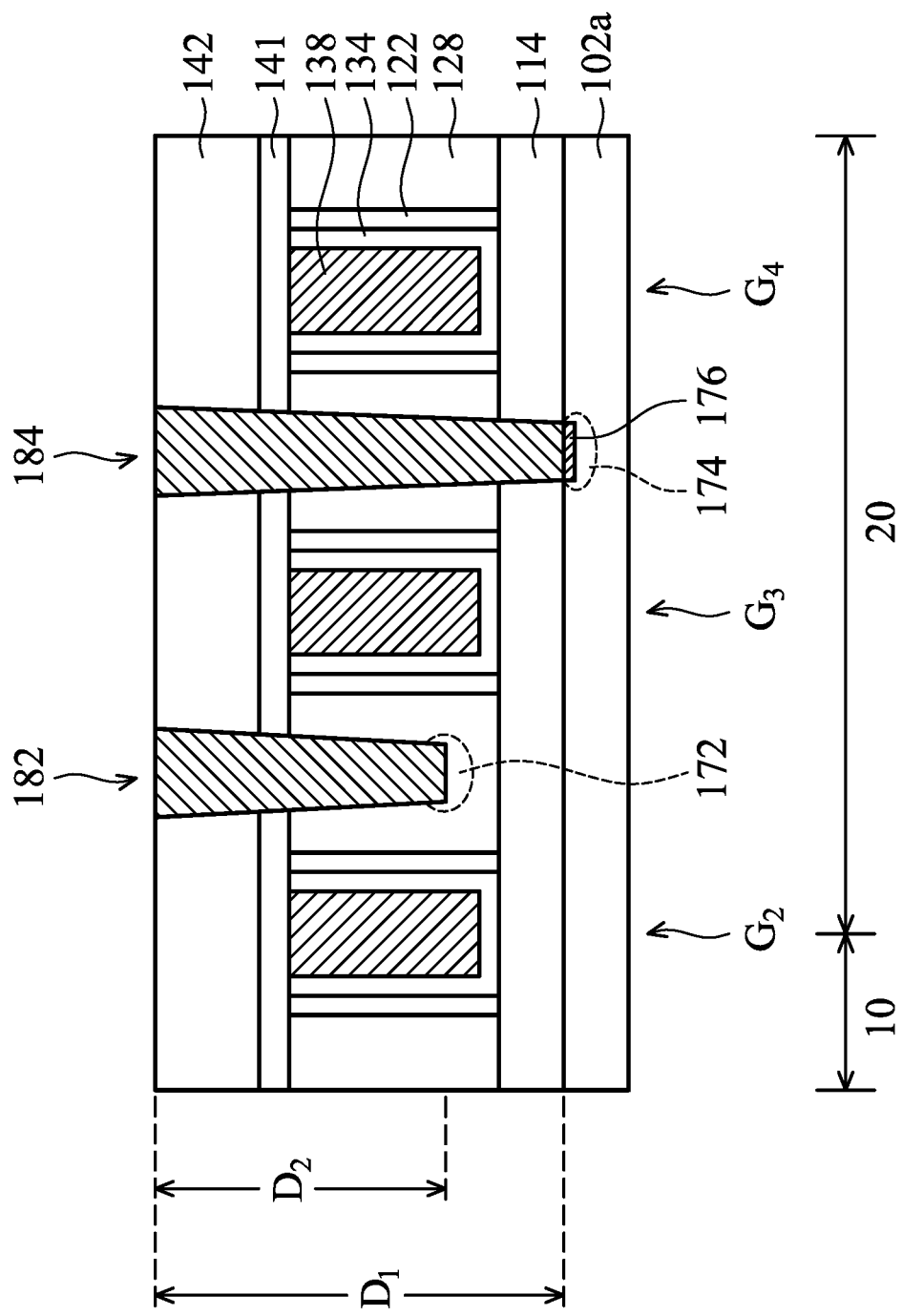

FIGS. 3A-3K show cross-sectional representations of various stages of forming the FinFET device structure 100 after the structure of FIG. 1H, in accordance with some embodiments of the disclosure. FIG. 3A shows a cross-sectional representation taken along the line A-A' of the FinFET device structure 100 in FIG. 2. FIG. 3A shows a cross-sectional representation taken along the line A-A' of the FinFET device structure 100 in FIG. 1H.

As shown in FIG. 3A, the first etching stop layer 141 is formed over the first dielectric layer 128, and the second dielectric layer 142 is formed over the first etching stop layer 141.

Afterwards, as shown in FIG. 3B, a second etching stop layer 144 is formed over the second dielectric layer 142, and a third dielectric layer 146 is formed over the second etching stop layer 144, in accordance with some embodiments of the disclosure. Next, a first PR structure 150 is a tri-layer structure which includes a first bottom anti-reflective coating (BARC) layer 154, a first middle layer 156 and a first top layer 158. In some embodiments, first BARC layer 154 is made of silicon oxynitride (SiON), silicon rich oxide, or silicon oxycarbide (SiOC). In some embodiments, first middle layer 156 is made of silicon nitride, silicon oxynitride or silicon oxide. In some embodiments, first top layer 158 is made of Poly (methyl methacrylate) (PMMA), Poly (methyl glutarimide) (PMGI), Phenol formaldehyde resin (DNQ/Novolac) or SU-8.

Next, as shown in FIG. 3C, the first top layer 158 is patterned to form a patterned first top layer 158, in accordance with some embodiments of the disclosure.

After first top layer 158 is patterned, a second etching process is performed on first middle layer 156, first BARC layer 154, the third dielectric layer 146 to form a first opening 157, in accordance with some embodiments of the disclosure. As a result, the second etching stop layer 144 is exposed.

Subsequently, as shown in FIG. 3D, the second etching stop layer 144 is etched, and the first PR structure 150 is removed, in accordance with some embodiments of the disclosure. The second dielectric layer 142 is exposed by the first opening 157.

Afterwards, as shown in FIG. 3E, a second PR structure 160 is formed in the first opening 157 and over the third dielectric layer 146, in accordance with some embodiments of the disclosure. The second PR structure 160 is a tri-layer structure which includes a second bottom anti-reflective coating (BARC) layer 164, a second middle layer 166 and a second top layer 168. The materials and forming method of the second PR structure 160 are similar to that of the first PR structure 150.

Next, as shown in FIG. 3F, the second top layer 168 is patterned to form a patterned top layer 168, and then the second middle layer 166, the second BARC layer 164, the third dielectric layer 146, the second etching stop layer 144, the second dielectric layer 142, the first etching stop layer 141, and a portion of the first dielectric layer 128 are removed to form a second opening 167, in accordance with some embodiments of the disclosure. Therefore, a portion of the first dielectric layer 128 is exposed by the second opening 167. The second opening 167 is formed by performing an etching process. The etching process may include multiple etching operations.

Afterwards, as shown in FIG. 3G, the second PR structure 160 is removed, in accordance with some embodiments of the disclosure. As a result, the first opening 157 is formed through the third dielectric layer 146 and the second etching stop layer 144. The second opening 167 is formed through the third dielectric layer 146, the second etching stop layer 144, the second dielectric layer 142, the first etching stop layer 141, and a portion of the first dielectric layer 128.

Afterwards, as shown in FIG. 3H, a portion of the first dielectric layer 128 below the first opening 157 is etched to form the first trench 159, and a portion of the first dielectric layer 128 and a portion of the isolation structure 114 are removed to form a second trench 169, in accordance with some embodiments of the disclosure. Therefore, the first opening 157 is elongated to form the first trench 159, and the second opening 167 is elongated to form the second trench 169.

The first dielectric layer 128 is exposed by the first trench 159, and the substrate 102 is exposed by the second trench 169. The first trench 159 is through the second etching stop layer 144, the second dielectric layer 142, the first etching stop layer 141 and a portion of the first dielectric layer 128. The second trench 169 is through the second etching stop layer 144, the second dielectric layer 142, the first etching stop layer 141, the first dielectric layer 128 and the isolation structure 114.

The second trench 169 has a first depth $D_1$ which is measured from the top surface of the second dielectric layer 142 to the top surface of the substrate 102. The first trench 159 has a second depth $D_2$ which is measured from the top surface of the second dielectric layer 142 to the bottom surface of the first trench 159. In some embodiments, the first depth $D_1$ is greater than the second depth $D_2$.

Furthermore, the second etching stop layer 144 may be etched, and therefore the thickness of the second etching stop layer 144 may be decreased from a first thickness $H_1$ to a second thickness $H_2$. Afterwards, the second etching stop layer 144 have been removed by an etching process.

Next, as shown in FIG. 3I, an ion implantation process 15 is performed on the exposed substrate 102 and the exposed first dielectric layer 128, in accordance with some embodiments of the disclosure.

As a result, a first doped region 172 is below the first trench 159, and a second doped region 174 is below the second trench 169. In some embodiments, the first doped region 172 and the second doped region 174 both are doped with p-type dopants, such as boron (B). In some embodiments, the first doped region 172 and the second doped region 174 both are doped with boron (B), and the doping concentration of the boron is in a range from about 1E18 to about 1E24 atoms/cm$^3$. When the doping concentration of boron is in the above-mentioned range, the resistance between the deep contact structure 184 and the substrate 102 is effectively reduced.

Next, as shown in FIG. 3J, the second etching stop layer 144 is removed, and a metal silicide layer 176 is formed below the second trench 169, in accordance with some embodiments of the disclosure. The metal silicide layer 176 is formed over the second doped region 174 and in direct contact with the second doped region 174. In other words, the metal silicide layer 176 is embedded in the second doped region 174.

The fabrication method of the metal silicide layer 176 is described below. The metal layer (not shown) is formed first. Afterwards, the metal layer reacts with the silicon in the substrate 102 to form the metal silicide layer 176 during the annealing process. The metal layer may be made of titanium (Ti), tantalum (Ta), or another applicable material. In some embodiments, the metal layer is made of titanium (Ti), and the metal silicide layer 176 is made of titanium silicide (TiSix). In some other embodiments, the metal layer is made of tantalum (Ta), and the metal silicide layer 176 is made of or tantalum silicide (TaSix).

The annealing process may be a thermal soaking process, a spike annealing process, a flash annealing process, or a laser annealing process. In some embodiments, the annealing process is operated at a temperature in a range from about 750 degrees to about 1100 degrees. In some embodiments, the annealing process is operated for a period of time in a range from about 10 μs to about 10 ms.

Next, as shown in FIG. 3K, a conductive material is filled into the first trench 159 to form a first contact structure 182 and into the second trench 169 to form a deep contact structure 184, in accordance with some embodiments of the disclosure. The first contact structure 182 is configured to act as internal electrical connections. The deep contact structure 184 is formed to provide a conductive path to release the charges which accumulate in the substrate 102.

The bottommost surface of the deep contact structure 184 is in direct physical contact with a topmost surface of the substrate 102. The deep contact structure 184 is through the second dielectric layer 142, the first etching stop layer 141, the first dielectric layer 128 and the isolation structure 114. The deep contact structure 184 is in direct contact with the substrate 102. The deep contact structure 184 is electrically connected to the substrate 102 through the metal silicide layer 176 and the doped region 174. The deep contact structure 184 is coupled to a ground voltage to release the electrons from the substrate 102 to the ground state.

It should be noted that the substrate 102 is made of semiconductor material, the metal silicide layer 176 is made of metal material, and therefore a barrier is between the semiconductor material and the metal material. If no interface layer between the metal silicide layer 176 and the substrate 102, there will exist at a junction between the metal silicide layer 176 and the substrate 102. The doped region 174 is configured to act as an interface layer to reduce contact resistance (Rcsd) between the metal silicide layer 176 and the substrate 102.

It should be noted that the deep contact structure 184 is through the multiple dielectric layer and the isolation structure 114 without passing through a fin structure and an epitaxial layer. The electrons accumulated in the substrate 102 are effectively released through the deep contact structure 184. Therefore, the contact resistance between the deep contact structure 184 and the substrate 102 is reduced. The contact resistance between the deep contact structure 184 and the substrate 102 is further reduced by the second doped region 174 and the metal silicide layer 176.

Furthermore, the disclosure provides the deep contact structure 184 through the multiple dielectric layers and the isolation structure 114 without passing through a fin structure and an epitaxial layer. Therefore, the "latch-up" issue is prevented. The "latch-up" is an adverse effect occurring in Complementary Metal-Oxide Semiconductor (CMOS) devices when a significant current flows through a Si substrate between N-type Metal-Oxide Semiconductor device (NMOS) and P-type Metal-Oxide Semiconductor device (PMOS) parts of CMOS structure and degrades its performance.

The first contact structure 182 and the deep contact structure 184 may be made of tungsten (W), tungsten alloy, aluminum (Al), aluminum alloy, copper (Cu) or copper alloy. The first contact structure 182 and the deep contact structure 184 may be formed by a deposition process, such as a chemical vapor deposition (CVD) process, physical vapor deposition (PVD) process, atomic layer deposition (ALD) process, plating process or another application process.

The deep contact structure 184 has a first depth $D_1$, and the first contact structure 182 has a second depth $D_2$. The first depth $D_1$ is greater than the second depth $D_2$. The bottom surface of the first contact structure 182 is higher than the bottom surface of the deep contact structure 184.

Figure 4A:
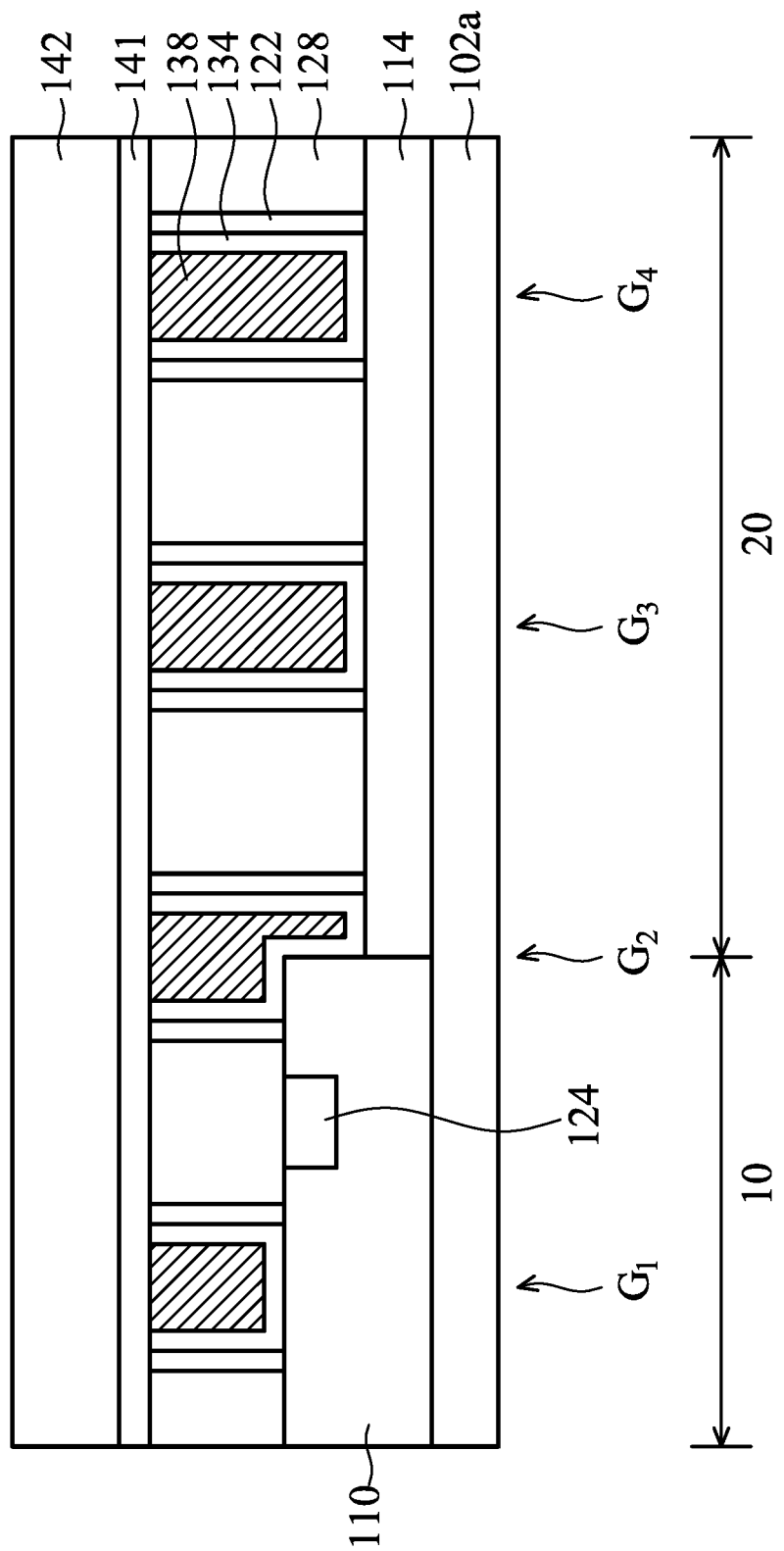
FIGS. 4A-4C show cross-sectional representations of various stages of forming the FinFET device structure after the structure of FIG. 1H, in accordance with some embodiments of the disclosure.
Figure 4B:
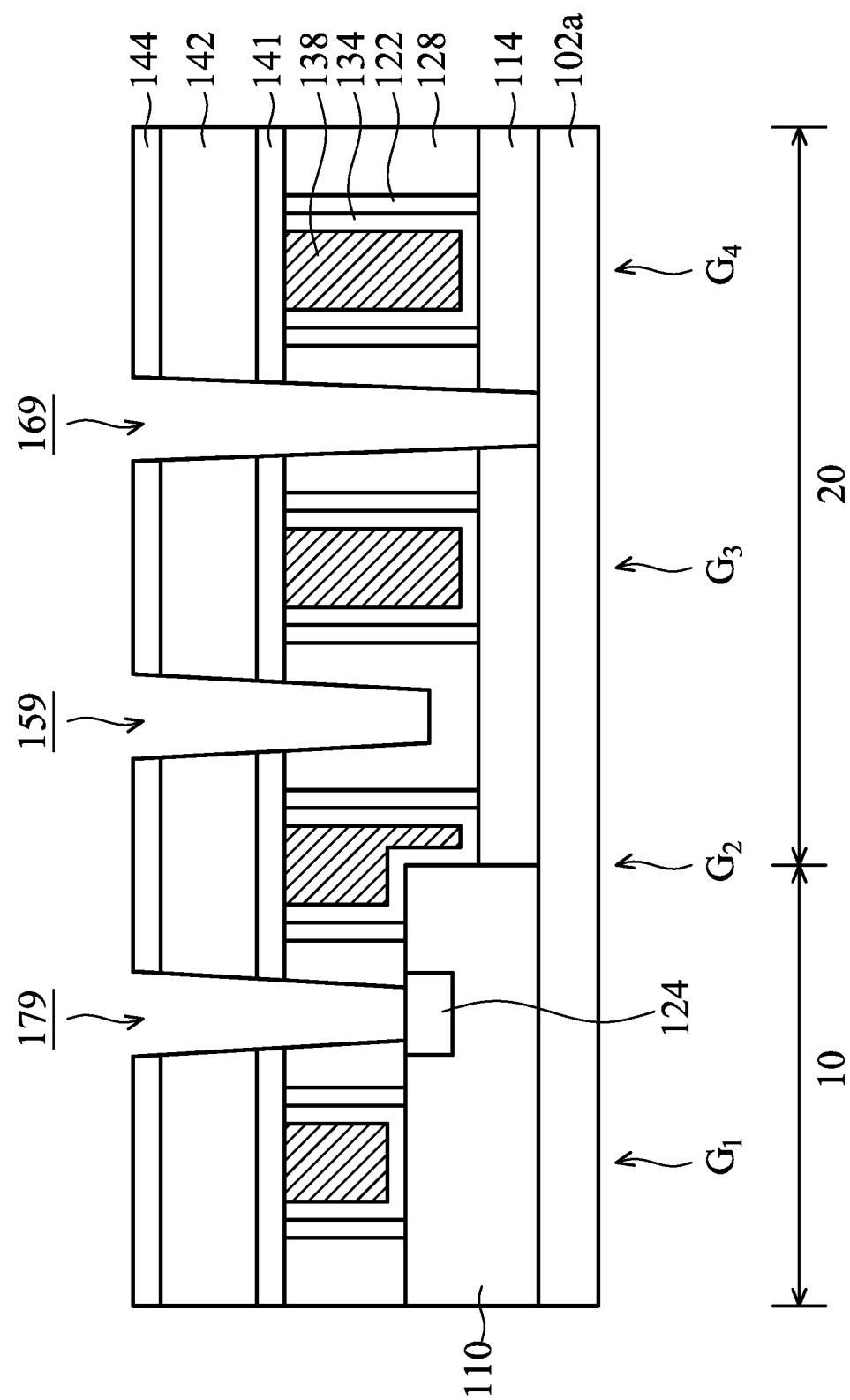
Figure 4C:
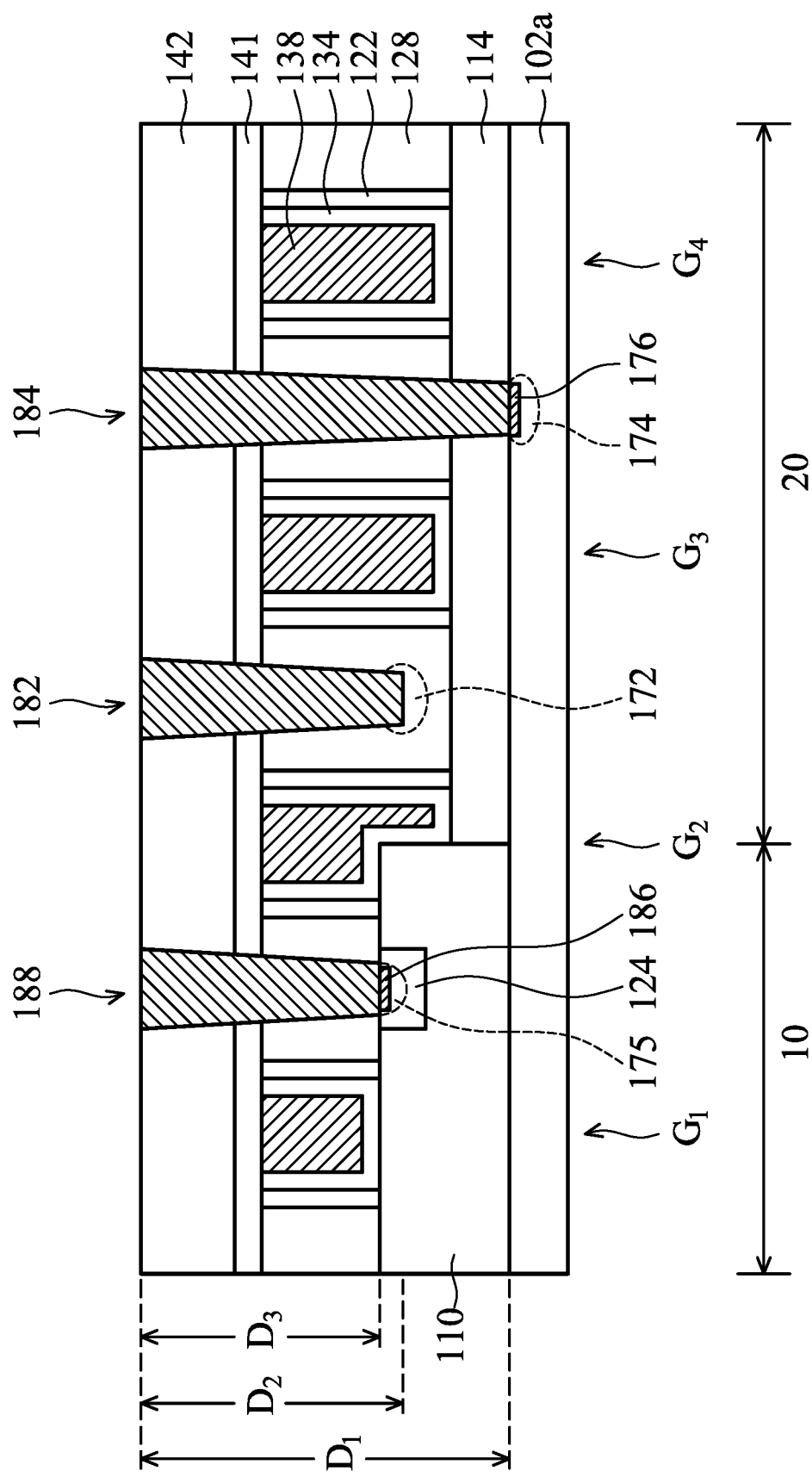

FIGS. 4A-4C show cross-sectional representations of various stages of forming the FinFET device structure 100 after the structure of FIG. 1H, in accordance with some embodiments of the disclosure. Some processes and materials used to form the FinFET device structure in FIGS. 4A-4C are similar to, or the same as, those used to form the FinFET device structure in FIGS. 3A-3K and are not repeated herein.

FIG. 4A shows a cross-sectional representation taken along the line B-B' of the FinFET device structure 100 in FIG. 2, in accordance with some embodiments of the disclosure. As shown in FIG. 4A, the first gate structure $G_1$ is formed over the fin structure 110. The source/drain (S/D) structures 124 are formed in the fin structure 110. In some embodiments, the source/drain (S/D) structures 124 are made of silicon-phosphorus (SiP), SiC or SiCP epitaxial material. The SiP, SiC or SiCP can be used in the recessed areas to create tensile stress in the channel of NMOS, since the lattice constant of SiP is smaller than that of silicon. The tensile stress is transferred into the channel and increases the electron mobility. A portion of the second gate structure $G_2$ is formed over the fin structure 110, and another portion of the second gate structure $G_2$ is formed over the isolation structure 114. The third gate structure $G_3$ and the fourth gate structure $G_4$ are over the isolation structure 114. In the second gate structure $G_2$, the gate dielectric layer 134 has an uneven bottom surface including a first part and a second part. The first part is directly formed on the fin structure 110, and the second part is directly formed on the isolation structure 114. The bottom surface of the first part is higher than the bottom surface of the second part.

Next, as shown in FIG. 4B, the first trench 159, the second trench 169 and the third trench 179 are formed in the first dielectric layer 128, in accordance with some embodiments of the disclosure. The first trench 159 is between the second trench 169 and the third trench 179. The first trench 159 is between the second gate structure $G_2$ and the third gate structure $G_3$, the second trench 169 is between the third gate structure $G_3$ and the fourth gate structure $G_4$, and the third trench 179 is between the first gate structure $G_1$ and the second structure $G_2$.

More specifically, the first trench 159 is through the second etching stop layer 144, the second dielectric layer 142, the first etching stop layer 141 and a portion of the first dielectric layer 128. The second trench 169 is through the second etching stop layer 144, the second dielectric layer 142, the first etching stop layer 141, the first dielectric layer 128 and the isolation structure 114. The third trench 179 is through the second etching stop layer 144, the second dielectric layer 142, the first etching stop layer 141 and the first dielectric layer 128. The source/drain (S/D) structures 124 are exposed by the third trench 179.

Afterwards, as shown in FIG. 4C, an ion implantation process (not shown) is performed to form the first doped region 172 below the first trench 159, the second doped region 174 below the second trench 169, and a third doped region 175 below the third trench 179, in accordance with some embodiments of the disclosure.

Afterwards, the metal silicide layer 176 is formed in the second doped region 174, and a metal silicide layer 186 is formed in the third doped region 175. In other words, the metal silicide layer 176 is embedded in the second doped region 174. The metal silicide layer 186 is embedded in the third doped region 175.

Next, a conductive material is filled into the first trench 159 to form the first contact structure 182, and into the second trench 169 to form the deep contact structure 184, and into the third trench 179 to form the S/D contact structure 188, respectively. The bottom surface of the deep contact structure 184 is lower than the bottom surface of the first contact structure 182. The bottom surface of the first contact structure 182 is lower than the bottom surface of the S/D contact structure 188. In other words, the bottom surface of the S/D contact structure 188 is higher than the bottom surface of the first contact structure 182, and the bottom surface of the first contact structure 182 is higher than the bottom surface of the deep contact structure 184.

The deep contact structure 184 has a first depth $D_1$ along a vertical direction, and the first contact structure 182 has a second depth $D_2$ along a vertical direction. The S/D contact structure 188 has a third depth $D_3$ along a vertical direction. In some embodiments, the first depth $D_1$ is greater than the second depth $D_2$, and the second depth $D_2$ is greater than the third depth $D_3$. In some other embodiments, the second depth $D_2$ is substantially equal than the third depth $D_3$.

It should be noted that the deep contact structure 184 is through the first dielectric layer 128 and the isolation structure 114 without passing through any epitaxial layer, and therefore the contact resistance (Rcsd) is well reduced.

Figure 5:
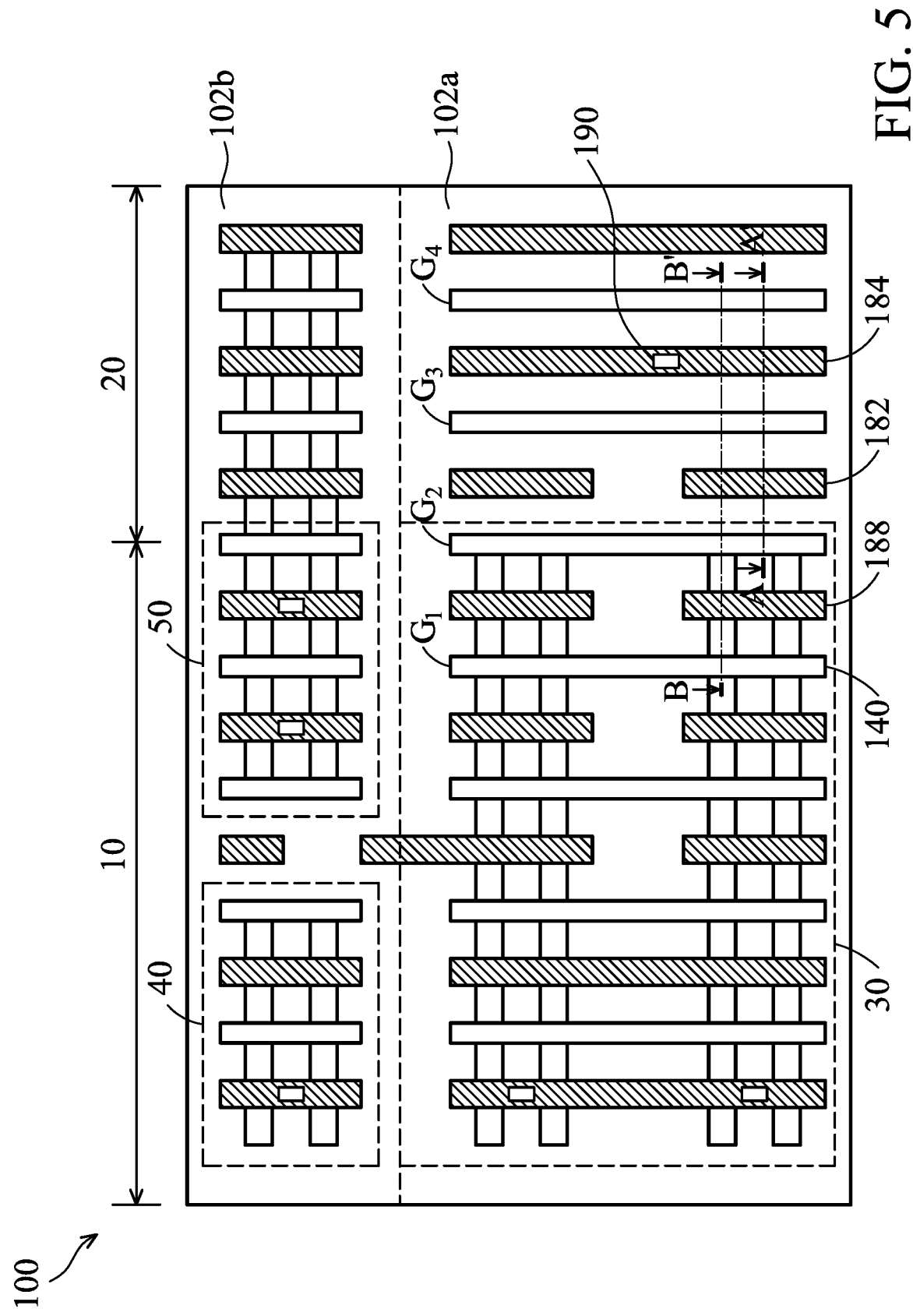
FIG. 5 shows a top-view of FinFET device structure after the first contact structure, the deep contact structure, and the S/D contact structure are formed, in accordance with some embodiments of the disclosure.

FIG. 5 shows a top-view of FinFET device structure 100 after the first contact structure 182, the deep contact structure 184, and the S/D contact structure 188 are formed, in accordance with some embodiments of the disclosure. FIG. 4C shows a cross-sectional representation taken along the line B-B' of the FinFET device structure 100 in FIG. 5, in accordance with some embodiments of the disclosure. FIG. 3K shows a cross-sectional representation taken along the line A-A' of the FinFET device structure 100 in FIG. 5, in accordance with some embodiments of the disclosure.

As shown in FIG. 5, the substrate 102 includes a p-type substrate 102a and a n-type substrate 102b. The substrate 102 includes the first region 10 and the second region 20. A NMOS device 30 is formed over the first region 10 of the p-type substrate 102a, and a PMOS device 40 and a second NMOS device 50 are formed over the first region 10 of the n-type substrate 102b. The first region 10 is the active region. It should be noted that the deep contact structure 184 is formed over the second region 20 of the p-type substrate 102a, and the second region 20 is a peripheral region. The deep contact structure 184 in the non-active region is configured to transfer the unwanted electrons to a ground to prevent the "latch-up" problem.

The gate structures G1, G2, G3 and G4 and the contact structures 182, 184 and 188 are arranged alternately. The S/D contact structure 188 is between the first gate structure $G_1$ and the second gate structure $G_2$. The first contact structure 182 is between the second gate structure $G_2$ and the third gate structure $G_3$. The deep contact structure 184 is between the third gate structure $G_3$ and the fourth gate structure $G_4$. Furthermore, a via 190 is formed on the deep contact structure 184 to connect to a ground voltage. The deep contact structure 184 is coupled to a ground voltage through the via 190. It should be noted that the deep contact structure 184 formed over the p-type substrate 102a to use as a p well pickup device. The number of the deep contact structure 184 is not limited to two. The number of the deep contact structure 184 can be adjusted according to the actual application.

In some embodiments, the deep contact structure 184 is used in a memory device, such as static random access memory (SRAM) or dynamic RAM (DRAM). In some other embodiments, the deep contact structure 184 is used in other device with the p-type substrate 102a and the n-type substrate 102b.

It should be noted that the deep contact structure 184 is through multiple layers and in direct contact with the substrate 102, and therefore the electrons can be transferred to the ground state through the deep contact structure 184 without passing through a fin structure and an epitaxial layer. The deep contact structure 184 is electrically connected to the substrate 102 though the second doped region 174 and the metal silicide layer 176, and therefore the contact resistance between the deep contact structure 184 and the substrate 102 is further reduced.

Embodiments for forming a FinFET device structure and method for formation the same are provided. A substrate having the active region and the peripheral region are provided. The fin structure is formed in the active region, and isolation structure is formed over the substrate. The first dielectric layer is formed on the isolation structure, and the gate structure is formed over the fin structure and in the first dielectric layer. A deep contact structure is through the first dielectric layer and the isolation structure. The deep contact structure is electrically connected to the substrate for releasing electrons or charges accumulated in the substrate. Since the deep contact structure is in direct contact with the substrate without passing through any fin structure or any epitaxial layer, the contact resistance between the deep contact structure and the substrate is reduced. Therefore, the performance of the FinFET device structure is improved.

In some embodiments, a FinFET device structure is provided. The FinFET device structure includes an isolation structure formed over a substrate, and a gate structure formed over the isolation structure. The FinFET device structure includes a first dielectric layer formed over the isolation structure and adjacent to the gate structure and a source/drain (S/D) contact structure formed in the first dielectric layer. The FinFET device structure also includes a deep contact structure formed through the first dielectric layer and adjacent to the S/D contact structure. The deep contact structure is through the isolation structure, and a bottom surface of the S/D contact structure is higher than a bottom surface of the deep contact structure.

In some embodiments, a FinFET device structure is provided. The FinFET device structure includes a substrate having a first region and a second region and an isolation structure formed over the substrate. The FinFET device structure further includes a fin structure formed in the first region of the substrate and a first dielectric layer formed over the fin structure and the isolation structure in the first region and the second region. The FinFET device structure also includes a first gate structure formed over the fin structure in the first region of the substrate and a second gate structure formed over the isolation structure in the second region of the substrate. The FinFET device structure includes a deep contact structure between the first gate structure and the second gate structure, and the deep contact structure is through the first dielectric layer and the isolation structure.

In some embodiments, a method for forming a FinFET device structure is provided. The method includes forming an isolation structure over a substrate and forming a first dielectric layer over the isolation structure. The method includes forming a gate structure in the first dielectric layer and forming a deep trench through the first dielectric layer and the isolation structure. The method also includes forming an S/D trench in the first dielectric layer and filling a metal material in the deep trench and the S/D trench to form a deep contact structure and the S/D contact structure. A bottom surface of the S/D contact structure is higher than a bottom surface of the deep contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    an isolation structure formed over a substrate;
    a gate structure formed over the isolation structure;
    a first dielectric layer formed over the isolation structure and adjacent to the gate structure;
    a source/drain (S/D) contact structure formed in the first dielectric layer;
    a deep contact structure formed through the first dielectric layer and adjacent to the S/D contact structure, wherein the deep contact structure penetrates into and through the isolation structure, and an entirety of the isolation structure is lower than a bottom surface of the gate structure, and a bottom surface of the S/D contact structure is higher than a bottom surface of the deep contact structure, wherein a bottom surface of the deep contact structure is in direct contact with an interface between the isolation structure and the substrate; and a second dielectric layer formed over the first dielectric layer, wherein the deep contact structure penetrates into and through the second dielectric layer.

2. The fin field effect transistor (FinFET) device structure as claimed in claim 1, further comprising:

a metal silicide layer formed below the deep contact structure, wherein the deep contact structure is electrically connected to the substrate through the metal silicide layer.

3. The fin field effect transistor (FinFET) device structure as claimed in claim 2, further comprising:

a doped region formed in the substrate, wherein the metal silicide layer is embedded in the doped region.

4. The fin field effect transistor (FinFET) device structure as claimed in claim 1, further comprising:

a fin structure formed over the substrate;

a source/drain (S/D) structure formed in the fin structure, wherein the S/D contact structure is formed over the S/D structure and is electrically connected to the S/D structure.

5. The fin field effect transistor (FinFET) device structure as claimed in claim 4, further comprising:

a middle contact structure between the deep contact structure and the S/D contact structure, wherein a bottom surface of the middle contact structure is higher than a bottom surface of the deep contact structure.

6. The fin field effect transistor (FinFET) device structure as claimed in claim 1, wherein the deep contact structure is coupled to a ground voltage.

7. A fin field effect transistor (FinFET) device structure, comprising:

a substrate having a first region and a second region;

an isolation structure formed over the substrate;

a fin structure formed in the first region of the substrate;

a first dielectric layer formed over the fin structure and the isolation structure in the first region and the second region;

a first gate structure formed over the fin structure in the first region of the substrate;

a second gate structure formed over and in direct contact with the isolation structure in the second region of the substrate;

a deep contact structure between the first gate structure and the second gate structure, wherein the deep contact structure penetrates into and through the first dielectric layer and the isolation structure and in direct contact with an interface between the second gate structure and the isolation structure;

a source/drain (S/D) structure formed over the fin structure and adjacent to the first gate structure;

a source/drain (S/D) contact structure formed over the S/D structure, wherein the S/D contact structure is electrically connected to the S/D structure; and a middle contact structure between the deep contact structure and the S/D contact structure, wherein a bottom surface of the middle contact structure is in direct contact with the first dielectric layer, and the bottom surface of the middle contact structure is higher than a bottom surface of the second gate structure and lower than a top surface of the second gate structure.

8. The fin field effect transistor (FinFET) device structure as claimed in claim 7, further comprising:

a metal silicide layer formed below the deep contact structure, wherein the metal silicide layer is in direct contact with the deep contact structure.

9. The fin field effect transistor (FinFET) device structure as claimed in claim 8, further comprising:

a doped region formed in the substrate, wherein the metal silicide layer is embedded in the doped region.

10. The fin field effect transistor (FinFET) device structure as claimed in claim 7, wherein the bottom surface of the middle contact structure is higher than a bottom surface of the deep contact structure.

11. The fin field effect transistor (FinFET) device structure as claimed in claim 10, wherein the deep contact structure has a first depth, the middle contact structure has a second depth, and the S/D contact structure has a third depth, and the second depth is greater than the third depth and smaller than the first depth.

12. The fin field effect transistor (FinFET) device structure as claimed in claim 10, further comprising:

a doped region formed below the middle contact structure.

13. The fin field effect transistor (FinFET) device structure as claimed in claim 7, further comprising:

an etching stop layer formed over the first dielectric layer; and a second dielectric layer formed over the etching stop layer, wherein the deep contact structure is through the second dielectric layer and the etching stop layer.

14. The fin field effect transistor (FinFET) device structure as claimed in claim 7, wherein the deep contact structure is coupled to a ground voltage.

15. A fin field effect transistor (FinFET) device structure, comprising:

a substrate having a first region and a second region;

an isolation structure formed over the substrate;

a fin structure formed in the first region of the substrate;

a first dielectric layer formed over the fin structure and the isolation structure in the first region and the second region;

a first gate structure formed over the fin structure in the first region of the substrate;

a S/D contact structure adjacent to the first gate structure, wherein the S/D contact structure has a first depth, wherein a portion of the S/D contact structure is lower than a top surface of the first gate structure;

a deep contact structure formed in the second region of the substrate, wherein the deep contact structure penetrates into and through the first dielectric layer and the isolation structure which has a bottom surface in direct contact with the substrate, a bottom surface of the deep contact structure is in direct contact with an interface between the isolation structure and the substrate, and the deep contact structure has a second depth, the second depth is greater than the first depth; and a metal silicide layer formed below the deep contact structure, wherein the metal silicide layer is lower than a bottom surface of the fin structure.

16. The fin field effect transistor (FinFET) device structure as claimed in claim 15, further comprising:

a middle contact structure between the S/D contact structure and the deep contact structure, wherein the middle contact structure has a third depth, and the third depth is greater than the first depth and smaller than the second depth.

17. The fin field effect transistor (FinFET) device structure as claimed in claim 1, wherein a bottom surface of the gate structure is in direct contact with a top surface of the isolation structure.

18. The fin field effect transistor (FinFET) device structure as claimed in claim 7, wherein a bottom surface of the second gate structure is in direct contact with a top surface of the isolation structure.

19. The fin field effect transistor (FinFET) device structure as claimed in claim 15, further comprising:
   a second gate structure formed over the isolation structure and over the second region of the substrate, wherein a bottom surface of the second gate structure is in direct contact with a top surface of the isolation structure.

20. The fin field effect transistor (FinFET) device structure as claimed in claim 15, wherein a portion of the metal silicide layer is lower than a top surface of the isolation structure.

\* \* \* \* \*